United States Patent
Nakahata et al.

(10) Patent No.: US 8,841,541 B2
(45) Date of Patent: Sep. 23, 2014

(54) SOLAR BATTERY AND METHOD OF MANUFACTURING THE SAME

(75) Inventors: Takumi Nakahata, Tokyo (JP); Kazunori Inoue, Tokyo (JP); Yusuke Yamagata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 315 days.

(21) Appl. No.: 13/394,023

(22) PCT Filed: Sep. 4, 2009

(86) PCT No.: PCT/JP2009/065500
§ 371 (c)(1),
(2), (4) Date: Mar. 2, 2012

(87) PCT Pub. No.: WO2011/027459
PCT Pub. Date: Mar. 10, 2011

(65) Prior Publication Data
US 2012/0160319 A1    Jun. 28, 2012

(51) Int. Cl.
| | | |
|---|---|---|
| *H01L 31/0224* | (2006.01) | |
| *H01L 31/0232* | (2014.01) | |
| *H01L 31/18* | (2006.01) | |
| *H01L 27/142* | (2014.01) | |
| *H01L 31/0392* | (2006.01) | |
| *H01L 31/052* | (2014.01) | |

(52) U.S. Cl.
CPC ........ *H01L 31/0527* (2013.01); *H01L 27/1423* (2013.01); *H01L 31/022425* (2013.01); *Y02E 10/52* (2013.01); *H01L 31/0392* (2013.01)
USPC ................ 136/246; 136/252; 438/72; 438/57

(58) Field of Classification Search
CPC ................ H01L 31/022425; H01L 31/02327; H01L 31/0527; H01L 31/0392
USPC .......................................................... 438/72
See application file for complete search history.

(56) References Cited

U.S. PATENT DOCUMENTS

| | | | |
|---|---|---|---|
| 5,401,330 A | 3/1995 | Saito et al. | |
| 6,172,296 B1 * | 1/2001 | Iwasaki et al. | 136/256 |
| 2008/0110498 A1 * | 5/2008 | Zafar et al. | 136/260 |

FOREIGN PATENT DOCUMENTS

| | | | |
|---|---|---|---|
| DE | 10248927 | * | 5/2004 |
| JP | 5 129640 | | 5/1993 |

(Continued)

OTHER PUBLICATIONS

Springer, Johann et al.; Machine translation of DE 10248927; printed May 22, 2014; pp. 1-5.*

(Continued)

*Primary Examiner* — Jeffrey T Barton
*Assistant Examiner* — Edward Schmiedel
(74) *Attorney, Agent, or Firm* — Oblon, Spivak, McClelland, Maier & Neustadt, L.L.P.

(57) ABSTRACT

In a solar battery including: a photoelectric conversion layer that converts light into electricity; and a reflecting electrode layer that is provided on an opposite side of a light incident side in the photoelectric conversion layer and reflects light passed through the photoelectric conversion layer to the photoelectric conversion layer side, to realize a reflecting electrode layer having excellent adhesion and thermal corrosion resistance, stable electrical characteristics and satisfactory light reflection characteristics and to obtain a solar battery having high reliability, excellent electrical characteristics and optical characteristics, the reflecting electrode layer includes, on the photoelectric conversion layer side, a metal layer containing silver as a main component and containing nitrogen.

15 Claims, 13 Drawing Sheets

(56) References Cited

FOREIGN PATENT DOCUMENTS

| JP | 6 77510 | 3/1994 |
| JP | 9 162430 | 6/1997 |
| JP | 10 133597 | 5/1998 |
| JP | 11 26787 | 1/1999 |
| JP | 11 158613 | 6/1999 |
| JP | 2002 110678 | 4/2002 |
| JP | 2002 226927 | 8/2002 |
| JP | 2002 235169 | 8/2002 |

OTHER PUBLICATIONS

Chinese Office Action issued Dec. 27, 2013, in China Patent Application No. 200980161223.3 (with English translation).
International Search Report Issued Dec. 1, 2009 in PCT/JP09/65500 Filed Sep. 4, 2009.

* cited by examiner

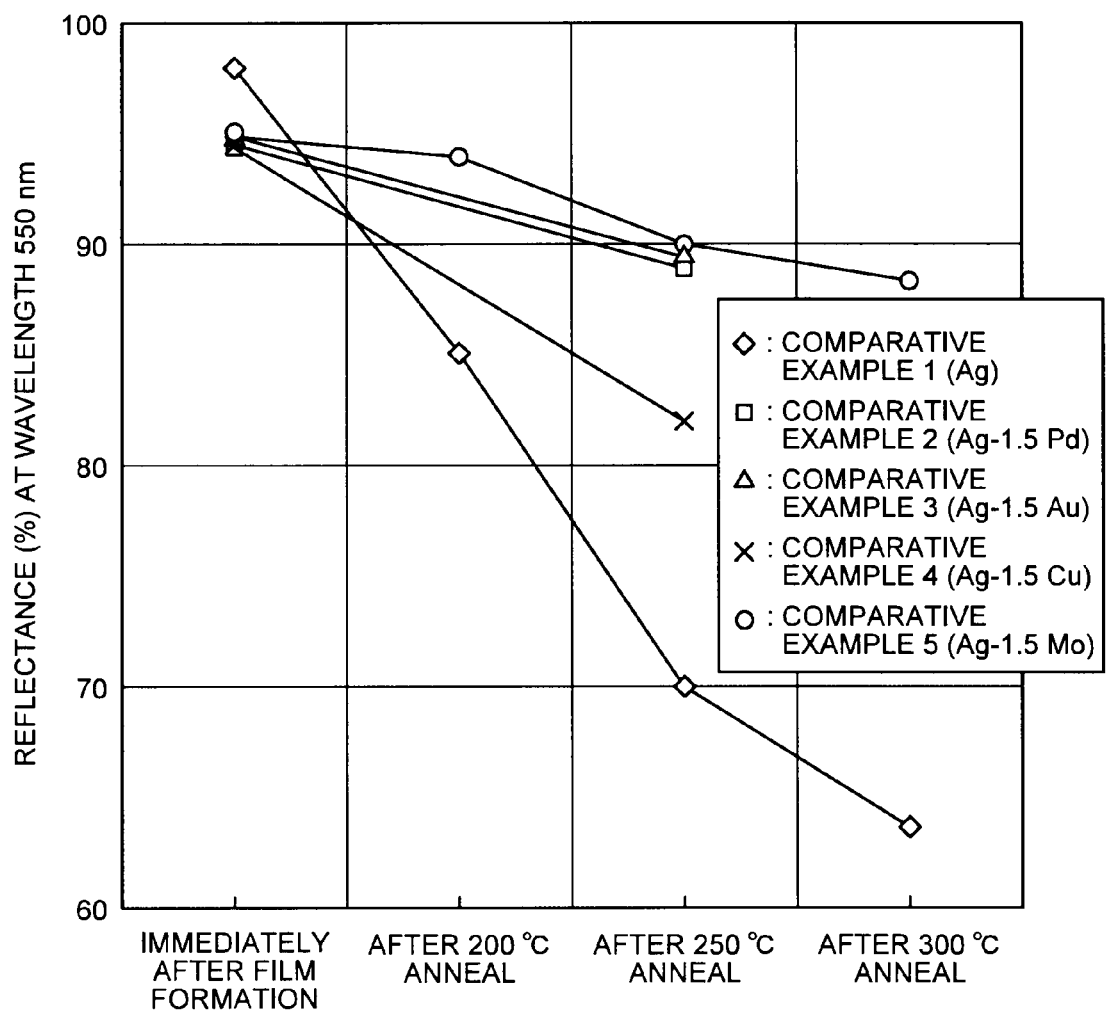

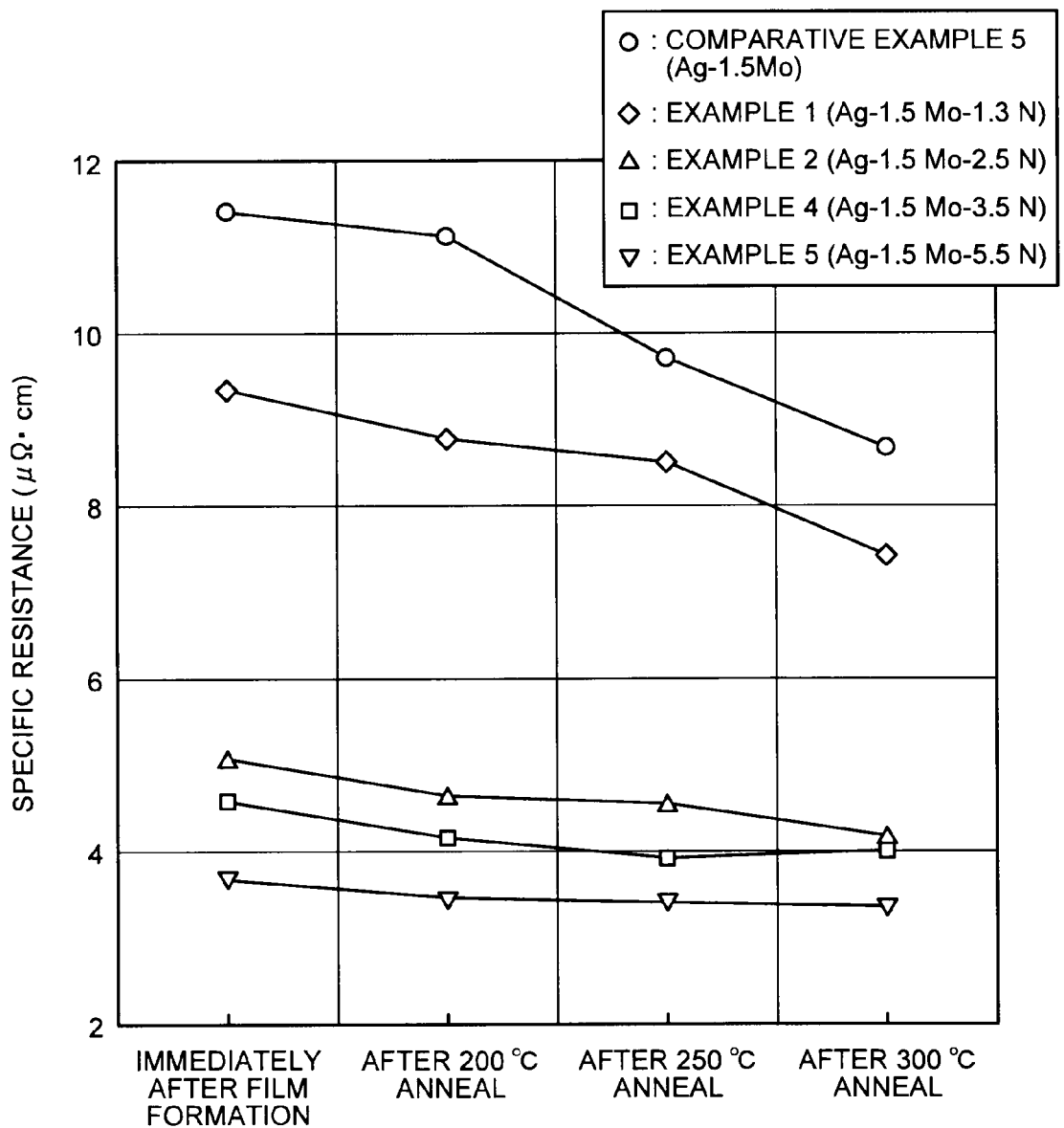

SOLAR BATTERY AND METHOD OF MANUFACTURING THE SAME

FIELD

The present invention relates to a solar battery including a reflecting electrode and a method of manufacturing the solar battery.

BACKGROUND

In a reflecting electrode for a solar battery (device) in the past, a silver (Ag) film or an Ag alloy film having electrically low resistance and high optical reflectance (hereinafter referred to as reflectance) is used. For example, Patent Literature 1 discloses a solar battery in which a monocrystal or polycrystal silicon substrate including a back electrode of silver or copper is used. Paste containing aluminum as a main component is applied to the monocrystal or polycrystal silicon substrate and baked. Thereafter, an aluminum silicon alloy layer is removed. An electrode of silver or copper is formed on an exposed surface of the substrate by a vacuum evaporation method, a sputtering method, or the like. In this solar battery, an effect of reflecting incident light from a front surface on a rear surface using a back electrode layer of silver or copper having a high reflectance is remarkable, leading to an increase in an output current and an improvement of a photoelectric conversion efficiency.

However, the Ag film and the Ag alloy film have a problem in that adhesion to the substrate is poor and the film peels during a patterning process. Further, the Ag film and the Ag alloy film have a problem in that corrosion resistance against heating and the like is low and, for example, because of oxidation of the film surface due to exposure in the atmosphere or heat treatment, a reflectance falls and a specific resistance value increases.

To solve such problems, for example, Patent Literature 2 discloses a structure in which a layer containing Ag as a main component and containing lead (pd) is provided as a back electrode of a thin-film solar battery. The content of Pd on the front surface side is reduced to suppress deterioration in a reflection effect.

Patent Literature 3 discloses a back electrode of a solar battery in which a transparent conductive film, Ag, and an aluminum (Al) or Al alloy are laminated in this order to suppress a fall in reflectance due to, for example, whitening of Ag. The back electrode is an electrode in which the thickness of Ag is equal to or larger than 60 nanometers and the thickness of Al or Al alloy is 1 to 20 nanometers.

Although not a solar battery, for example, a technology for forming an Ag alloy reflection film and an adhesive layer between an Ag alloy and a substrate is disclosed in, for example, Patent Literature 4 and Patent Literature 5.

Patent Literature 4 discloses, as an Ag alloy reflection film having all of high reflectance, heat resistance in a process, corrosion resistance, and adhesion to a substrate, an Ag alloy reflection film containing 0.2 at % to 5 at % in total of one or more kinds of elements selected out of cerium (Ce), neodymium (Nd), samarium (Sm), gadolinium (Gd), terbium (Tb), and dysprosium (Dy) and the remainder substantially formed of Ag.

Patent Literature 5 discloses that nitrogen content of a base substrate in an interface section between an Ag alloy film and the base substrate is increased to improve adhesion to the base substrate. As a method of realizing such a base substrate, Patent Literature 5 discloses that the surface of the base substrate is subjected to nitriding treatment in advance through reverse sputtering by nitrogen plasma or nitrogen gas. Further, Patent Literature 5 discloses that a large amount of nitrogen is contained in an interface portion of the Ag alloy film with a gate insulating film to prevent oxidation of the Ag alloy film. As a method of realizing such an Ag alloy film, Patent Literature 5 discloses that the film surface of the Ag alloy film is subjected to reverse sputtering by nitrogen plasma or nitrogen gas after formation of the Ag alloy film.

CITATION LIST

Patent Literature

Patent Literature 1: Japanese Patent Application Laid-open No. H5-129640
Patent Literature 2: Japanese Patent Application Laid-open No. H11-026787
Patent Literature 3: Japanese Patent Application Laid-open No. H9-162430
Patent Literature 4: Japanese Patent Application Laid-open No. 2002-226927
Patent Literature 5: Japanese Patent Application Laid-open No. 2002-110678

SUMMARY

Technical Problem

However, the technologies disclosed in Patent Literature 2 and Patent Literature 3 improve corrosion resistance by depositing a metal component having better corrosion resistance than and different from Ag on the rear surface side of the back electrode. However, the front surface side of the back electrode is made of Ag having high purity. Therefore, an effect of improving adhesion of the back electrode and a base is small.

In the technology disclosed in Patent Literature 4, although the reflectance of the Ag alloy film and the corrosion resistance and the adhesion to the substrate of the Ag alloy film are taken into account, electrical characteristics of the Ag alloy film are not taken into account.

In the technology disclosed in Patent Literature 5, only nitrogen density of the interface of the Ag alloy film with the base substrate or the film surface is increased to improve adhesion and prevent oxidation. However, it is difficult to precisely control the nitrogen density of the interface of the Ag alloy film with the base substrate or the film surface. When the nitrogen density of the interface of the Ag alloy film with the base substrate or the film surface fluctuates, the electrical characteristics become unstable. In particular, contact resistance of the Ag alloy film and other conductive films electrically connected to the Ag alloy film substantially changes.

On the other hand, the reflecting electrode of the solar battery reflects light passed through the photoelectric conversion layer to the photoelectric conversion layer side again. High reflectance and satisfactory electrical conduction properties are required.

The present invention has been devised in view of the above and it is an object of the present invention to obtain a solar battery having high reliability, excellent electrical characteristics and excellent optical characteristics and a method of manufacturing the solar battery.

Solution to Problem

In order to solve above-mentioned problems and to achieve the object, a solar battery according to the present invention includes a photoelectric conversion layer that converts light into electricity; and a reflecting electrode that is provided on an opposite side of a light incident side in the photoelectric conversion layer and reflects light passed through the photoelectric conversion layer to the photoelectric conversion layer side. The solar battery is characterized in that the reflecting electrode includes, on the photoelectric conversion layer side, a metal layer containing silver as a main component and containing nitrogen.

Advantageous Effects of Invention

According to the present invention, because the solar battery includes the reflecting electrode excellent in adhesion to a base layer and thermal corrosion resistance and having stable electrical characteristics and satisfactory light reflection characteristics, there is an effect that it is possible to obtain a solar battery having high reliability, excellent electrical characteristics and excellent optical characteristics.

BRIEF DESCRIPTION OF DRAWINGS

FIG. 1-2 is a diagram for explaining a sectional structure in a lateral direction of a thin-film solar battery cell according to the first embodiment of the present invention.

FIG. 2 is a graph of anneal temperature dependency of reflectance values of an Ag alloy film according to examples and an Ag alloy film according to comparative examples.

FIG. 3 is a graph of anneal temperature dependency of reflectance values of an Ag alloy film according to comparative examples in the first embodiment of the present invention.

FIG. 7 is a graph of anneal temperature dependency of the specific resistance of the Ag alloy film in the first embodiment of the present invention.

FIG. 8-1 is a sectional view for explaining an example of a manufacturing process for the thin-film solar battery module according to the first embodiment.

FIG. 8-2 is a sectional view for explaining the example of the manufacturing process for the thin-film solar battery module according to the first embodiment.

FIG. 8-3 is a sectional view for explaining the example of the manufacturing process for the thin-film solar battery module according to the first embodiment.

FIG. 8-4 is a sectional view for explaining the example of the manufacturing process for the thin-film solar battery module according to the first embodiment.

FIG. 8-5 is a sectional view for explaining an example of the manufacturing process for the thin-film solar battery module according to the first embodiment.

FIG. 8-6 is a sectional view for explaining an example of the manufacturing process for the thin-film solar battery module according to the first embodiment.

FIG. 8-7 is a sectional view for explaining an example of the manufacturing process for the thin-film solar battery module according to the first embodiment.

FIG. 10-1 is a sectional view for explaining an example of a manufacturing process for the silicon substrate type solar battery according to the second embodiment of the present invention.

FIG. 10-2 is a sectional view for explaining the manufacturing process for the silicon substrate type solar battery according to the second embodiment of the present invention.

FIG. 10-3 is a sectional view for explaining the manufacturing process for the silicon substrate type solar battery according to the second embodiment of the present invention.

FIG. 10-4 is a sectional view for explaining the manufacturing process for the silicon substrate type solar battery according to the second embodiment of the present invention.

FIG. 10-5 is a sectional view for explaining the manufacturing process for the silicon substrate type solar battery according to the second embodiment of the present invention.

FIG. 10-6 is a sectional view for explaining the manufacturing process for the silicon substrate type solar battery according to the second embodiment of the present invention.

FIG. 10-7 is a sectional view for explaining the manufacturing process for the silicon substrate type solar battery according to the second embodiment of the present invention.

DESCRIPTION OF EMBODIMENTS

Figure 1:
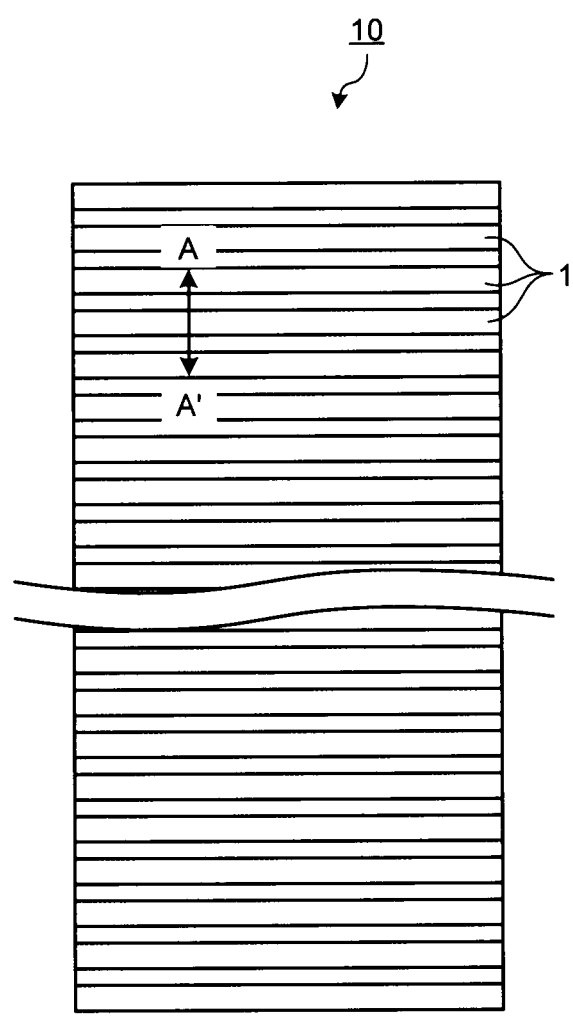
FIG. 1-1 is a plan view of a schematic configuration of a thin-film solar battery module according to a first embodiment of the present invention.

The inventor found that it is possible to improve, by further adding nitrogen to an Ag alloy film containing Ag as a main component publicly-known in the past, adhesion of the Ag alloy film and a substrate and thermal corrosion resistance of the Ag alloy film. The present invention has been devised based on the knowledge. Embodiments of a solar battery and a method of manufacturing the solar battery according to the present invention are explained below based on the drawings. The present invention is not limited to the following description and can be changes as appropriate without departing from the spirit of the present invention. In the drawings referred to below, for easiness of understanding, in some case, scales of members are different from actual scales. The same holds true among the drawings.

First Embodiment

Figures 1, 2:
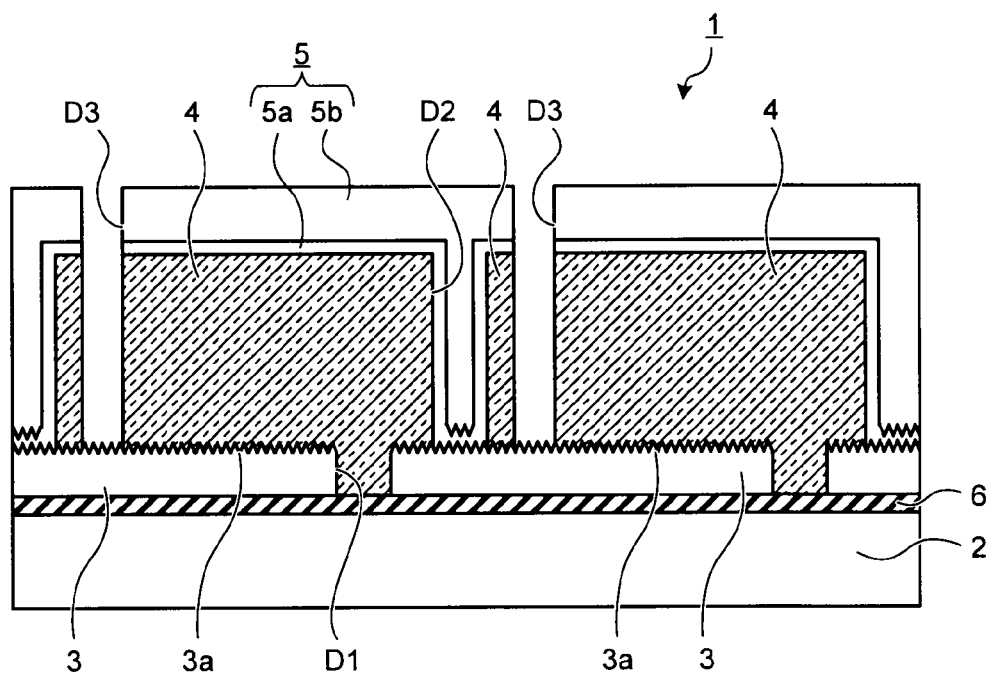
Figure 2:
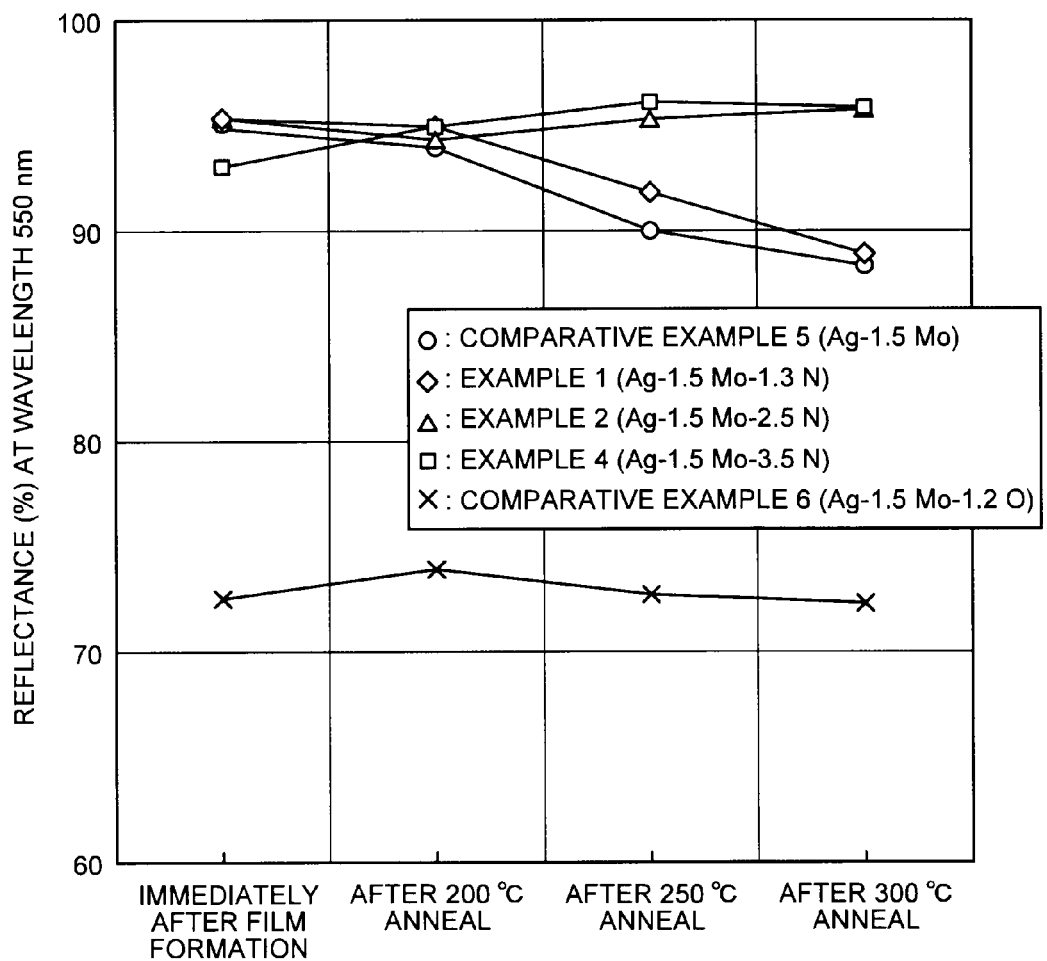

FIG. 1-1 is a plan view of a schematic configuration of a thin-film solar battery module (hereinafter referred to as module) 10, which is a thin-film solar battery, according to a first embodiment of the present invention. FIG. 1-2 is a diagram for explaining a sectional structure in a lateral direction of a thin-film solar battery cell (hereinafter referred to as cell in some case) included in the module 10 and is a main part sectional view in a line A-A' direction of FIG. 1-1.

As shown in FIGS. 1-1 and 1-2, the module 10 according to the first embodiment includes a plurality of strip-like (rectangular) cells 1 formed on a translucent insulating substrate 2 and has a structure in which these cells 1 are electrically connected in series. As shown in FIG. 1-2, the cell 1 has a structure in which the translucent insulating substrate 2, a transparent electrode layer 3 formed on the translucent insulating substrate 2 and serving as a first electrode layer, a photoelectric conversion layer 4, which is a thin-film semiconductor layer, formed on the transparent electrode layer 3, and a back electrode layer 5 formed on the photoelectric conversion layer 4 and serving as a second electrode layer are sequentially laminated. As shown in FIG. 1-2, an undercoat layer 6 of silicon oxide (hereinafter simply referred to as $SiO_2$) is provided on the translucent insulating substrate 2 as a blocking layer for impurities according to necessity. The back electrode layer 5 is a reflecting electrode layer that reflects light passed through the photoelectric conversion layer 4 to the photoelectric conversion layer 4 again and functions as an electrode.

In the transparent electrode layer 3 formed on the translucent insulating substrate 2, stripe-like first grooves D1 extending in a direction substantially parallel to a lateral direction of the translucent insulating substrate 2 and reaching the translucent insulating substrate 2 are formed. The photoelectric conversion layer 4 is embedded in the sections of the first grooves D1, whereby the transparent electrode layer 3 is formed to be separated for each cell to extend over the cell 1.

In the photoelectric conversion layer 4 formed on the transparent electrode layer 3, stripe-like second grooves (connection grooves) D2 extending in the direction substantially parallel to the lateral direction of the translucent insulating substrate 2 and reaching the transparent electrode layer 3 are formed in places different from the first grooves D1. The back electrode layer 5 is embedded in the sections of the second grooves (connection grooves) D2, whereby the back electrode layer 5 is connected to the transparent electrode layer 3. Because the transparent electrode layer 3 extends over the cell 1 adjacent thereto, the back electrode layer 5 of one of adjacent two cells and the transparent electrode layer 3 of the other are electrically connected.

In the back electrode layer 5 and the photoelectric conversion layer 4, stripe-like third grooves D3 (separation grooves) reaching the transparent electrode layer 3 are formed in places different from the first grooves D1 and the second grooves (connection grooves) D2. The cells 1 are separated. Because the transparent electrode layer 3 of the cell 1 is connected to the back electrode layer 5 of the cell 1 adjacent thereto in this way, the adjacent cells 1 are electrically connected in series.

The transparent electrode layer 3 is formed of a transparent conductive oxide film of zinc oxide (ZnO), indium tin oxide (ITO), tin oxide ($SnO_2$), or the like or a translucent film such as a film obtained by adding aluminum (Al) to the transparent conductive oxide film. The transparent electrode layer 3 can be a ZnO film, an ITO film, or a $SnO_2$ film in which at least one or more kinds of elements selected out of aluminum (Al), gallium (Ga), indium (In), boron (B), yttrium (Y), silicon (Si), zirconium (Zr), and titanium (Ti) is used as a dopant or a transparent conductive film formed by laminating these films and only has to be a transparent conductive film having optical transparency. The transparent electrode layer 3 has a surface texture structure in which unevenness $3a$ is formed on the surface. This texture structure has a function of scattering incident sunlight and improving efficiency of light utilization in the photoelectric conversion layer 4.

The photoelectric conversion layer 4 has a PN junction or a PIN junction and is configured by laminating one or more thin film semiconductor layers that perform power generation using incident light. In this embodiment, as the photoelectric conversion layer 4, a laminated film obtained by laminating a p-type hydrogenated crystallite silicon (μc-Si:H) layer, which is a first conductive semiconductor layer, an i-type hydrogenated crystallite silicon (μc-Si:H) layer, which is a second conductive semiconductor layer, and an n-type hydrogenated crystallite silicon (μc-Si:H) layer, which is a third conductive semiconductor layer, from the transparent electrode layer 3 side is formed. Other examples of the photoelectric conversion layer 4 include a laminated film obtained by laminating a p-type hydrogenated amorphous silicon carbide (a-Sic:H) layer, which is the first conductive semiconductor layer, an i-type hydrogenated amorphous silicon (a-Si:H) layer, which is the second conductive semiconductor layer, and an n-type hydrogenated crystallite silicon (μc-Si:H) layer, which is the third conductive semiconductor layer, from the transparent electrode layer 3 side.

The photoelectric conversion layer 4 can have a configuration of PIN junctions of two stages including a p-type hydrogenated amorphous silicon carbide (a-Sic:H) layer, which is the first conductive semiconductor layer, an i-type hydrogenated amorphous silicon (a-Si:H) layer, which is the second conductive semiconductor layer, and an n-type hydrogenated crystallite silicon (μc-Si:H) layer, which is the third conductive semiconductor layer, a p-type hydrogenated crystallite silicon (μc-Si:H) layer, which is the first conductive semiconductor layer, an i-type hydrogenated crystallite silicon (μc-Si:H) layer, which is the second conductive semiconductor layer, and an n-type hydrogenated crystallite silicon (μc-Si:H) layer, which is the third conductive semiconductor layer. In the case of a tandem structure, the tandem structure may be a tandem structure in which two or more unit photoelectric conversion layers obtained by laminating the first conductive semiconductor layer, the second conductive semiconductor layer, and the third conductive semiconductor layer are laminated. When a plurality of thin-film semiconductor layers are laminated to configure the photoelectric conversion layer 4 as in the PIN junctions of the two stages, an intermediate layer of monoxide crystallite silicon (μc-SiO), aluminum added zinc oxide (ZnO:Al), or the like can be inserted between the PIN junctions to improve electrical and optical connection between the PIN junctions.

The back electrode layer 5 is patterned in a shape and a position different from those of the photoelectric conversion layer 4 and includes a transparent conductive metal compound layer 5a and a reflecting electrode layer 5b as shown in FIG. 1-2. For example, tin oxide ($SnO_2$), zinc oxide (ZnO), or ITO or a combination of these elements can be used for the transparent conductive metal compound layer 5a.

The reflecting electrode layer 5b according to this embodiment is a metal layer formed of an Ag film or an Ag alloy film. One end of the reflecting electrode layer 5b is electrically connected to the photoelectric conversion layer 4 and the other end is electrically connected to the transparent electrode layer 3. The Ag alloy film is an alloy film containing silver (Ag) as a main component and containing one or more kinds of elements selected out of magnesium (Mg), titanium (Ti), chrome (Cr), copper (Cu), molybdenum (Mo), palladium (Pd), platinum (Pt), and gold (Au) as additional components. "Main component" means a component having the highest atom content.

The Ag film or the Ag alloy film forming the reflecting electrode layer 5b contains nitrogen (N). Because the Ag film or the Ag alloy film contains an appropriate amount of nitrogen, the Ag film or the Ag alloy film has higher reflectance and more satisfactory electrical characteristics than the Ag film or the Ag alloy film alone (not containing nitrogen). Therefore, because the Ag film or the Ag alloy film forming the reflecting electrode layer 5b contains nitrogen, the Ag film or the Ag alloy film functions as a reflecting electrode layer having excellent light reflection characteristics and electrical characteristics. "The Ag film containing nitrogen or the Ag alloy film containing nitrogen" is hereinafter generally referred to as "Ag—Nx alloy film" or "Ag—N alloy film" in some case.

The content of nitrogen contained in the reflecting electrode layer 5b has an effect on improvement of light reflection characteristics and electrical characteristics even if the content is, for example, 0.1 at % or higher. Further, it is desirable to set the content of nitrogen contained in the reflecting electrode layer 5b to 0.5 at % or higher and 5 at % or lower. When the ratio of nitrogen contained in the reflecting electrode layer 5b is set in such a range, more satisfactory light reflection characteristics can be obtained.

"at %" means atomic % (atomic percent). For example, the content of nitrogen of 5 at % indicates that, when a total number of atoms forming the Ag alloy film is one hundred, five nitrogen atoms are present in the one hundred atoms. The content can be measured by X-ray photoelectron spectroscopy (XPS). Specifically, the content can be obtained by obtaining intensity A of a peak due to Ag and intensity B of a peak due to N with XPS measurement, multiplying these peak intensities with a sensitivity factor, and comparing the peak intensities. The content can be obtained in the same manner using Secondary Ion Mass Spectrometry (SIMS).

The thickness of the reflecting electrode layer 5b, which is such a metal layer containing nitrogen, is desirably 50 nanometer or more to obtain satisfactory reflectance and electrical characteristics. When the thickness of the reflecting electrode layer 5b is set to 150 nanometers or more, more satisfactory reflectance and electrical characteristics can be obtained. However, if the thickness of the metal layer containing nitrogen is too large, the reflecting electrode layer 5b could tend to be peeled by stress in the reflecting electrode layer 5b. Therefore, it is desirable to set the thickness of the reflecting electrode layer 5b to 500 nanometers or less.

The reflecting electrode layer 5b can include a metal layer formed of the Ag—N alloy film and other conductive films. In this case, the metal layer is formed on the photoelectric conversion layer 4 side, i.e., a reflection surface side on which light is made incident in the reflecting electrode layer 5b.

The reflecting electrode layer 5b is more desirably formed of the Ag alloy film than a pure Ag film because the reflecting electrode layer 5b is excellent in terms of corrosion resistance. The Ag alloy film is formed by adding one or more kinds of elements (hereinafter referred to as "additional elements" in some case) selected out of magnesium (Mg), titanium (Ti), chrome (Cr), copper (Cu), molybdenum (Mo), palladium (Pd), platinum (Pt), and gold (Au) to silver (Ag) as additional components. This makes it possible to suppress oxidation of the film surface due to heating and prevent clouding of the film surface due to oxidation compared with the Ag film not added with these additional elements. Consequently, it is possible to suppress a fall in the reflectance of the film surface due to oxidation by heating. In the Ag film not added with nitrogen and not added with the additional elements, the film surface is oxidized by heating, clouding of the film surface due to oxidation occurs, and the reflectance markedly falls. More specifically, the reflecting electrode layer 5b is more desirably formed of an AgMo—N alloy film, a film composition of which is Ag-1.5 at % Mo-3.0 at % N.

In the following explanation, a result of a test carried out using an Ag—Mo alloy film containing Mo as an additional element is explained below. The fall in reflectance due to oxidation by heating of the Ag alloy film can be minimized by adding Mo. Therefore, among the additional elements, it is desirable to use Mo. However, when another element is contained as the additional element instead of Mo or when the metal layer contains only Ag, a same effect as the effect of the Ag—Mo alloy film containing nitrogen can be obtained if the nitrogen is contained.

Manufacturing Example

Sputtering was carried out using an alloy target having Ag-1.5 at % Mo composition under a plasma atmosphere of a mixed gas obtained by adding a nitrogen ($N_2$) gas in an argon (Ar) gas, which was an inactive gas, while being distributed at a partial pressure ratio equal to or higher than 1.5% and equal to or lower than 12% to form and manufacture an Ag—Mo—N alloy film containing nitrogen at thickness of 200 nanometers. When the compositions of manufactured samples were analyzed by induced coupled plasma (abbreviation: ICP) spectrometry and X-ray photoelectron spectroscopy (abbreviation: XPS), a molybdenum composition ratio was 1.5 at % Mo in all the samples. A nitrogen composition ratio changed between 1.3 at % or higher and 5.5 at % or lower according to the partial pressure ratio of the nitrogen ($N_2$) gas with respect to a mixed gas. Nitrogen atoms were present at substantially equal density in the film.

According to the result explained above, it was found that the Ag alloy film containing nitrogen at the content in a range of 1.3 at % or higher and 5.5 at % or lower can be controlled relatively easily and highly accurately and with high reproducibility by controlling partial pressure of the $N_2$ gas in the mixed gas in carrying out the sputtering.

A relation between the partial pressure ratio of the N2 gas and the nitrogen composition ratio of the film is arbitrarily determined according to a sputtering apparatus in use and specifications thereof and process conditions and is not limited by the numerical values explained above.

Test Examples

In test examples explained below, unless specifically referred to, a nitrogen content was changed and an Ag alloy film containing nitrogen was formed using an alloy target containing various additional elements in the same manner as the manufacturing example explained above. In the comparison examples, an Ag film and an Ag alloy film were formed in the same manner as the manufacturing example except that a target and an atmospheric gas were changed.

In the test examples explained below, unless specifically referred to, films of examples 1 to 4 and comparative examples 1 to 6 were evaluated. The example 1 is an Ag—Mo—N alloy film of "Ag-1.5 at % Mo-1.3 at % N", a film content of which is molybdenum content of 1.5 at % and nitrogen content of 1.3 at % and the remainder of which is Ag. Film compositions of the examples 2 to 4 are respectively "Ag-1.5Mo-2.5 at % N", "Ag-1.5 at % Mo-3.0 at % N", and "Ag-1.5 at % Mo-3.5 at % N". Film compositions of the comparative examples 1 to 6 are respectively "Ag", "Ag-1.5 at % Pd", "Ag-1.5 at % Au", "Ag-1.5 at % Cu", "Ag-1.5 at % Mo", and "Ag-1.5 at % Mo-1.2 at % O".

Test Example 1

In this test example, concerning an Ag film and an Ag alloy film, after film formation, annealing for maintaining the films at various anneal temperatures for thirty minutes was carried out and a relation between reflectance values on film surfaces and the anneal temperatures was evaluated.

FIG. 2 is a graph of anneal temperature dependency of reflectance values of Ag alloy films according to the examples and Ag alloy films according to the comparative examples. In FIG. 2, reflectance values of the Ag alloy films at respective stages immediately after film formation at the time when nitrogen was added at various contents to form Ag alloy films having Mo content of 1.5 at %, after anneal at 200° C., after anneal at 250° C., and after anneal at 300° C. are plotted. In FIG. 2, the abscissa indicates anneal temperature and the ordinate indicates reflectance (%) at a wavelength of 550 nanometers. In FIG. 2, a result obtained when oxygen was added instead of nitrogen to form an Ag alloy film having Mo content of 1.5 at % is also shown. In FIG. 2, the reflectance of the example 1 at nitrogen content of 1.3 at % is indicated by a diamond sign, the reflectance of the example 2 at nitrogen content of 2.5 at % is indicated by a triangle sign, the reflectance of the example 4 at nitrogen content of 3.5 at % is indicated by a square sign, the reflectance of the comparative example 5 in which nitrogen was not added is indicated by a circle sign, and the reflectance of the comparative example 6 with oxygen content of 1.2 at % is indicated by a x sign.

Figures 1, 8:
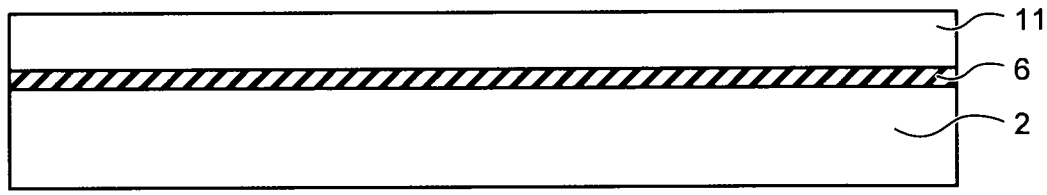
Figures 2, 8:
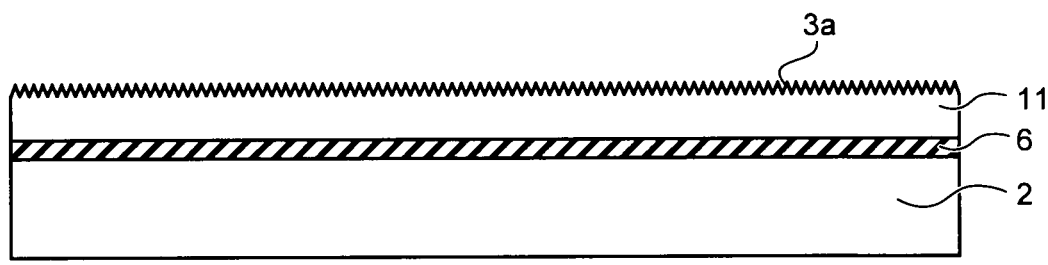
Figures 3, 8:
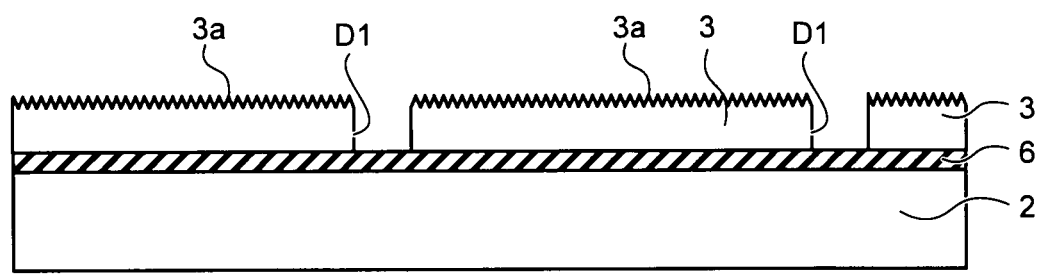
Figures 4, 8:
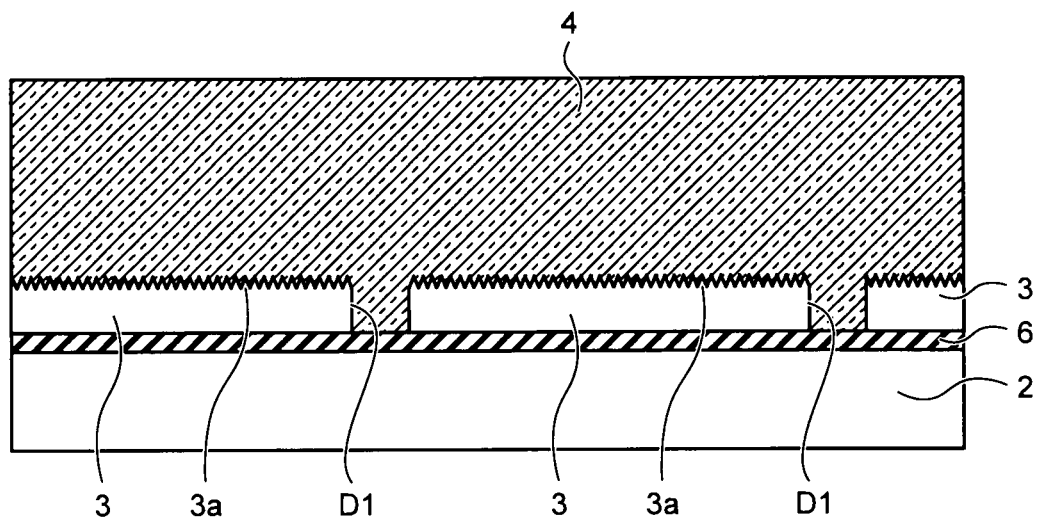
Figures 5, 8:
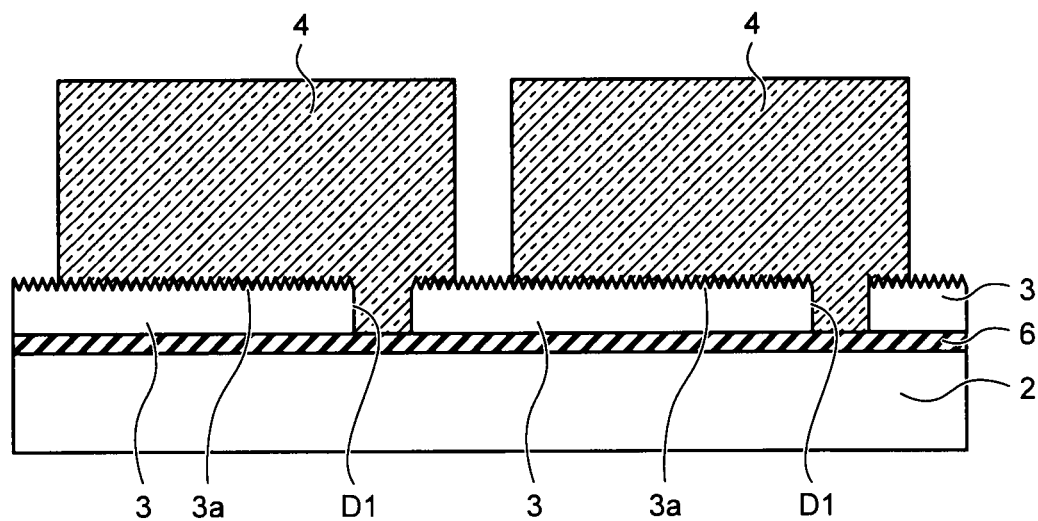
Figures 6, 8:
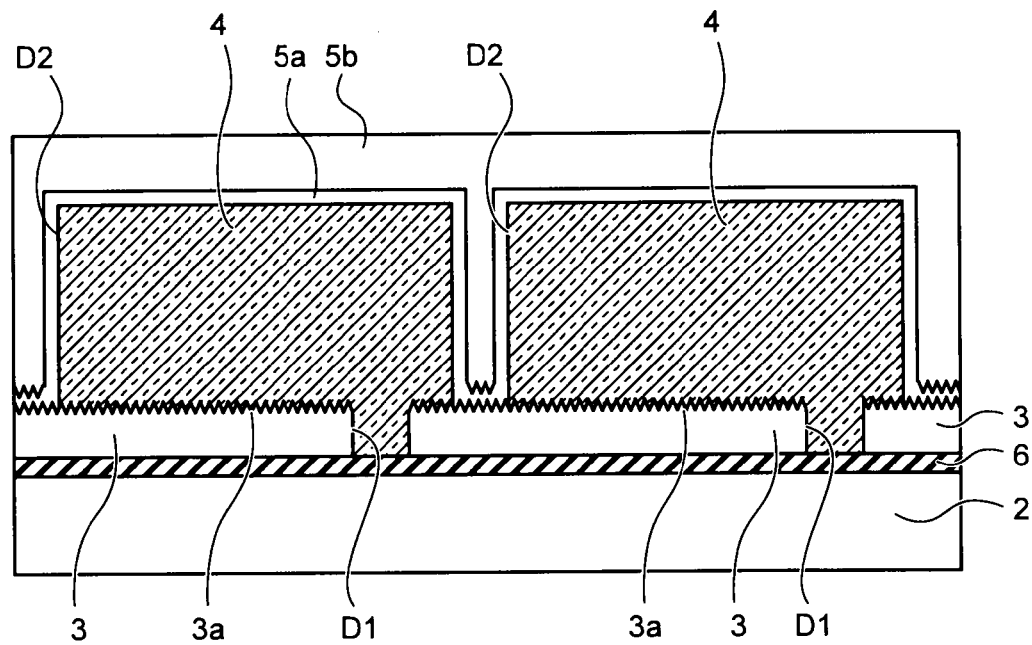

FIG. 3 is a graph of anneal temperature dependency of reflectance values of Ag alloy films according to the comparative examples. In FIG. 3, reflectance values of the Ag alloy films at respective stages immediately after film formation at the time when an Ag film not added with an additional element was formed and elements Pd, Au, Cu, and Mo were added to Ag at content of 1.5 at % to form an Ag alloy film, after anneal at 200° C., after anneal at 250° C., and after anneal at 300° C. are plotted. In FIG. 3, the abscissa indicates anneal temperature and the ordinate indicates reflectance (%) at a wavelength of 550 nanometers. In FIG. 3, the reflectance of the comparative example 1 in which an additional element was not added is indicated by a diamond sign, the reflectance of the comparative example 2 in which Pd was added is indicated by a square sign, the reflectance of the comparative example 3 in which Au was added is indicated by a triangle sign, the reflectance of the comparative example 4 in which Cu was added is indicated by a x sign, and the reflectance of the comparative example 5 in which Mo was added is indicated by a circle sign.

Concerning the films of the examples 1 to 4 and the comparative examples 1 to 6, reflectance (%) at a wavelength of 550 nanometers after annealing was carried out at the anneal temperatures is shown in Table 1.

TABLE 1

| | | Reflectance (%) at wavelength 550 nm | | | |
| --- | --- | --- | --- | --- | --- |
| | Film composition | Immediately after film formation | After anneal at 200° C. | After anneal at 250° C. | After anneal at 300° C. |
| Comparative example 1 | Ag | 98 | 85 | 70 | 63.5 |
| Comparative example 2 | Ag-1.5 Pd | 94.5 | — | 89 | — |
| Comparative example 3 | Ag-1.5 Au | 95.1 | — | 89.5 | — |
| Comparative example 4 | Ag-1.5 Cu | 94.5 | — | 82 | — |
| Comparative example 5 | Ag-1.5 Mo | 95.1 | 94 | 90 | 88.5 |
| Example 1 | Ag-1.5 Mo-1.3 N | 95.5 | 95 | 92 | 89 |
| Example 2 | Ag-1.5 Mo-2.5 N | 95.5 | 94.5 | 95.4 | 95.9 |
| Example 3 | Ag-1.5 Mo-3.0 N | 95.9 | 96.2 | 95.6 | 94.4 |
| Example 4 | Ag-1.5 Mo-3.5 N | 93.2 | 95 | 96.2 | 96 |
| Comparative example 6 | Ag-1.5 Mo-1.2 O | 72.7 | 74 | 72.9 | 72.5 |

As it is evident from the results shown in FIGS. 2 and 3 and Table 1, in the Ag film of the comparative example 1 in which the additional element such as Mo or nitrogen was not added, clouding due to heating occurs and reflectance markedly falls. Specifically, in the comparative example 1, although the reflectance value immediately after formation of the Ag film is 98%, the reflectance after anneal at 200° C. is 85%, the reflectance after anneal at 250° C. is 70%, the reflectance after anneal at 300° C. is 63.5%. The reflectance falls according to the heating.

On the other hand, in the Ag alloy films according to the comparative examples 2 to 5 in which appropriate additional elements were selected and added to Ag, as shown in Table 1, the reflectances immediately after film formation are respectively 94.5%, 95.1%, 94.5%, and 95.1%. A reflectance value slightly falls because of the addition of the additional elements immediately after film formation. However, the reflectances after anneal at 250° C. in the Ag alloy films of the comparative examples 2 to 5 are respectively 89%, 89.5%, 82%, and 90%. Compared with 70% of the Ag film of the comparative example 1, it is seen that a fall in the reflectance due to oxidation by heating is suppressed.

Therefore, it is seen that the addition of Pd, Au, Cu, and Mo as the additional elements has a significant effect on prevention of a reflectance fall due to oxidation by heating. Although not explained as an example, additional elements such as Mg, Ti, Pt, and Cr also have an effect on prevention of a reflectance fall due to oxidation by heating. A silver-molybdenum-nitrogen (Ag—Mo—N) alloy film obtained by selecting, as an example, a silver-molybdenum (Ag—Mo) alloy film out of the Ag alloys containing these additional elements and adding nitrogen is the Ag alloy film of the examples 1 to 4.

In the examples 1 to 4 in which nitrogen was added at content equal to or higher than 1.3 at % and equal to or lower than 3.5 at %, an improvement effect for suppressing a fall in reflectance due to heating treatment was recognized more than the comparative example 5 of Ag-1.5 at % Mo not added with nitrogen. Further, in the example 2 and the example 4 in which nitrogen was added at content equal to or higher than 2.5 at % and equal to or lower than 3.5 at %, an effect that a reflectance value was rather improved by an annealing effect due to heating was obtained.

The comparative example 6 is an Ag—Mo—O alloy film obtained by adding oxygen to Ag-1.5 at % Mo with a sputtering method using a mixed gas of an Ar gas and an $O_2$ gas. In the comparative example 6, an effect of suppressing a fall in reflectance due to heating is recognized. However, it is seen that the reflectance of the film immediately after film formation markedly falls, specifically, falls to 70% to 75%. Therefore, it is seen that an Ag—O alloy film obtained by adding oxygen to the Ag alloy film is undesirable for a use for a reflection film.

Test Example 2

Figure 4:
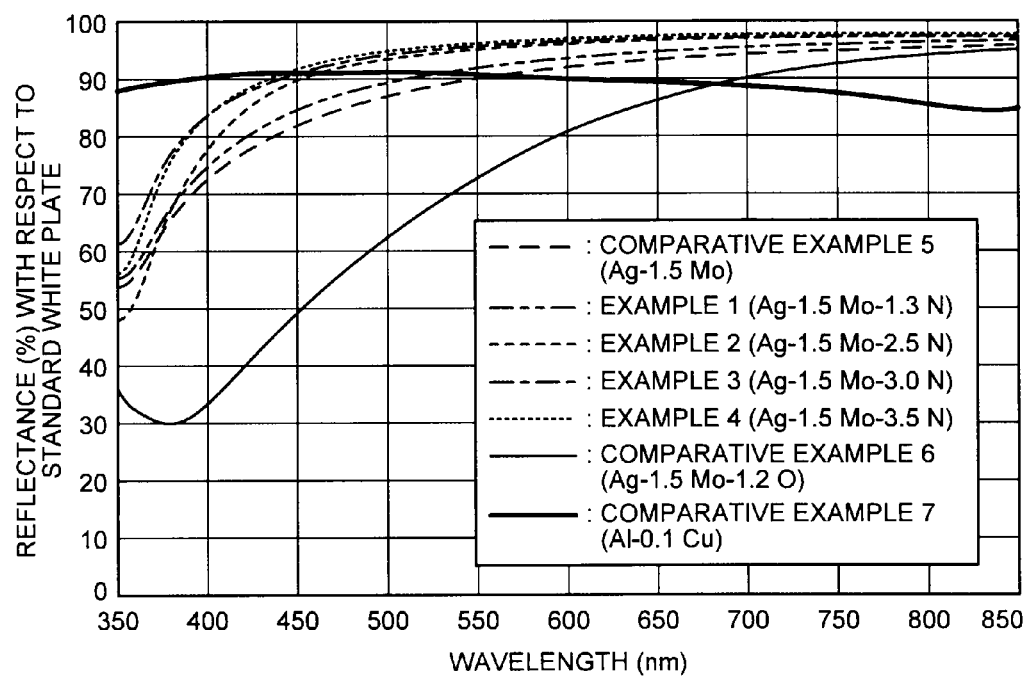
FIG. 4 is a graph of spectral reflectances in a visible light region of an Ag alloy film in the first embodiment of the present invention.

In this test example, concerning various Ag—Mo—N alloy films having different nitrogen contents, spectral reflectance in a visible light region after annealing at 250° C. for thirty minutes was measured. The "visible light region" means a region where wavelength is equal to or larger than 350 nanometers and equal to or smaller than 850 nanometers and is a region of many wavelengths included in a spectrum of the sunlight. The reflecting electrode of the solar battery desirably has high reflectance in these wavelengths. In this test example, spectral reflectances are measured in the same manner concerning an Ag film and an Ag-mo-O alloy film added with oxygen instead of nitrogen. FIG. 4 is a graph of spectral reflectances in the visible light region of the Ag alloy film. Reflectance values with respect to a standard white plate of Ag alloy films having Mo content of 1.5 at % formed by adding nitrogen at various contents are plotted as a graph. In FIG. 4, spectral reflectance values of the Ag—Mo—N alloy films in a visible light region having wavelength equal to or larger than 350 nanometers and equal to or smaller than 850 nanometers after heat treatment at 250° C. for thirty minutes are shown. A result obtained when oxygen is added instead of nitrogen to form an Ag alloy film having Mo content of 1.5 at % is also shown in FIG. 4. Specifically, in FIG. 4, measurement results concerning the films of the examples 1 to 4 in which film compositions are "Ag-1.5 at % Mo-1.3 at %", "Ag-1.5 at % Mo-2.5 at % N", "Ag-1.5 at % Mo-3.0 at % N", and "Ag-1.5 at % Mo-3.5 at % N" and the comparative examples 5 to 7 in which film compositions are "Ag-1.5 at % Mo", "Ag-1.5 at % Mo-1.2 at % O" and "Al-0.1 at % Cu" are shown. In FIG. 4, the abscissa indicates wavelength (nm) and the ordinate indicates reflectance (%) with respect to the standard white plate.

It is seen from the graph of FIG. 4 that, in the examples 1 to 4 in which nitrogen was added, compared with the comparative example 5 that is the Ag—Mo alloy film not added with nitrogen, reflectance values were improved over a wavelength region of visible light. Therefore, it is seen that the Ag alloy film added with the additional elements and added with nitrogen can improve the spectral reflectance in the wavelength region of the visible light compared with the Ag alloy film added with the additional elements but not added with nitrogen.

In the test examples explained above, a reason why the reflectance value after heating treatment of the Ag alloy film can be maintained or improved by the addition of nitrogen is not completely clear. However, it is considered that this is because of effects that a fall in the reflectance value is smaller in AgNx combined with nitrogen than AgOx combined with oxygen, and Ag selectively combined with nitrogen is precipitated to an Ag grain boundary as an AgNx compound, works as a barrier layer, and prevents deterioration due to oxidation of Ag crystal grains, and grain growth of the Ag crystal gains due to heating is suppressed to reduce roughness of the film surface to improve flatness and further maintain the flatness with high uniformity.

Test Example 3

In this test example, a nitrogen composition ratio, i.e., nitrogen content in an Ag alloy film was changed and reflectances were measured concerning Ag alloy films having respective nitrogen contents, and a relation between the nitrogen contents and the reflectances was evaluated. In this test example, an Ag—Mo—O alloy film added with oxygen instead of nitrogen was evaluated in the same manner.

Figure 5:
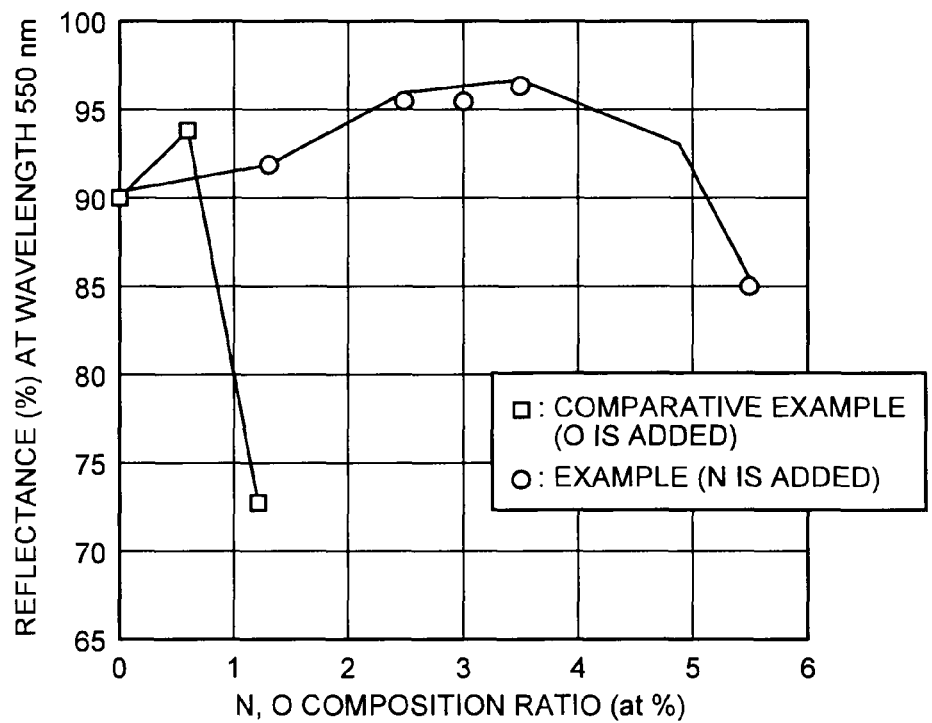
FIG. 5 is a graph of nitrogen composition ratio dependency of the reflectance of the Ag alloy film in the first embodiment of the present invention.

FIG. 5 is a graph of nitrogen composition ratio dependency of the reflectance of the Ag alloy film and is a graph of a relation between nitrogen composition ratios, i.e., nitrogen contents at the time when nitrogen was added at various contents to form Ag alloy films having Mo content of 1.5 at % and the reflectances of the Ag alloy films. In FIG. 5, the reflectance (%) of an Ag—Mo—N alloy film at wavelength of 550 nanometers after heating treatment at 250° C. for thirty minutes is shown (an example). A result obtained when oxygen was added instead of nitrogen to form an Ag alloy film having Mo content of 1.5 at % is also shown in FIG. 5 (a comparative example). In FIG. 5, the abscissa indicates a composition ratio (at %) of nitrogen atoms or oxygen atoms and the ordinate indicates reflectance (%) at wavelength of 550 nanometers. In FIG. 5, the comparative example in which oxygen was added is indicated by a square sign and the example in which nitrogen was added is indicated by a circle sign.

In Table 2, concerning the Ag alloy films of the example and the comparative example, reflectance (%) at each nitrogen composition ratio (nitrogen content) and oxygen composition ratio (oxygen content) is shown.

TABLE 2

| N, O composition ratio (at %) | Reflectance (%) at wavelength 550 nm | |
| --- | --- | --- |
| | Comparative example (O was added) | Example (N was added) |
| 0 | 89.9 | 89.9 |
| 0.6 | 93.8 | — |
| 1.2 | 72.8 | — |
| 1.3 | — | 91.9 |
| 2.5 | — | 95.6 |
| 3.0 | — | 95.5 |
| 3.5 | — | 96.4 |
| 5.5 | — | 85 |

As shown in FIG. 5 and Table 2, in the example in which nitrogen was added, the reflectance is improved as the nitrogen composition ratio increases. However, the reflectance changes to tend to fall when the nitrogen composition ratio is equal to or higher than 3.5 at % and equal to or lower than 5.5 at %. However, the reflectance at the nitrogen composition ratio of 5.5 at % is 85%. Compared with the comparative example in which oxygen was added, relatively satisfactory reflectance characteristics are maintained.

It is seen that, when a reflectance value at wavelength of 550 nanometers of the Al alloy film shown as a comparative example 7 in FIG. 4, specifically, about 90% is set as a reference, although slightly fluctuating according to an initial reflectance value of the Ag alloy film serving as a base, characteristics can be maintained in which a composition ratio, i.e., content of nitrogen added to an Ag alloy is substantially equal to or lower than 5 at % and high reflectance characteristics, specifically, reflectance of the Ag alloy film with respect to an Al alloy film is equal to or lower than 90% and a desirable result can be obtained. It is seen that, when a composition ratio of nitrogen atoms is set to be equal to or higher than 2.5 at % and equal to or lower than 3.5 at %, reflectance equal to or higher than 95% can be obtained and a more desirable result can be obtained.

From FIG. 5, it is expected that the addition of nitrogen has an effect on improvement of reflectance even if nitrogen is added in a small amount of about 0.1 at %. These results are in the case of an Ag—Mo alloy film having excellent heat resistance. In the case of an Ag film and other alloy films, it can be expected that the effect is more conspicuous. For example, it is advisable that nitrogen equal to or higher than 0.5 at % is contained in the Ag film or the other alloy films.

As shown in FIG. 5, when the content of nitrogen is too large, the reflectance tends to fall. Therefore, it is considered that there is an upper limit to obtain the reflectance improvement effect. It is surmised from FIG. 5 that, when the content of nitrogen exceeds 5 at % in the case of the Ag—Mo alloy film, the reflectance further falls than in the case of 0 at % in which nitrogen is not added. This tendency is considered to be the same in a metal film containing Ag as a main component. Therefore, it is considered desirable to set the content of nitrogen in a range of content equal to or higher than 0.5 at % and equal to or lower than 5 at % to increase the reflectance.

FIGS. 4 and 5 are results concerning the reflectance after heating treatment at 250° C. for thirty minutes. There is also an effect on prevention of a fall in the reflectance due to heating at lower temperature and a long-term fall in the reflectance.

From the results explained above, it is seen that the reflectance is improved by further adding nitrogen atoms to the Ag alloy film added with the additional elements. It is seen that this reflectance improvement effect changes to tend to fall in a range of the content of nitrogen equal to or higher than 3.5 at % and equal to or lower than 5.5 at % but relatively satisfactory reflectance characteristics can be maintained compared with the case in which oxygen is added.

It is seen that it is possible to maintain high reflectance characteristics compared with a film not added with nitrogen by setting the content of nitrogen in the Ag alloy film to 5 at % or lower. It is seen that, in particular, it is possible to obtain satisfactory reflectance equal to or higher than 95% by setting the content of nitrogen to 2.5 at % or higher and 3.5 at % or lower.

Test Example 4

In this test example, a nitrogen composition ratio, i.e., nitrogen content in an Ag alloy film was changed and specific resistance values were measured concerning Ag alloy films having respective nitrogen contents, and a relation between the nitrogen contents and the specific resistances was evaluated. In this test example, an Ag—Mo—O alloy film added with oxygen instead of nitrogen was evaluated in the same manner.

Figure 6:
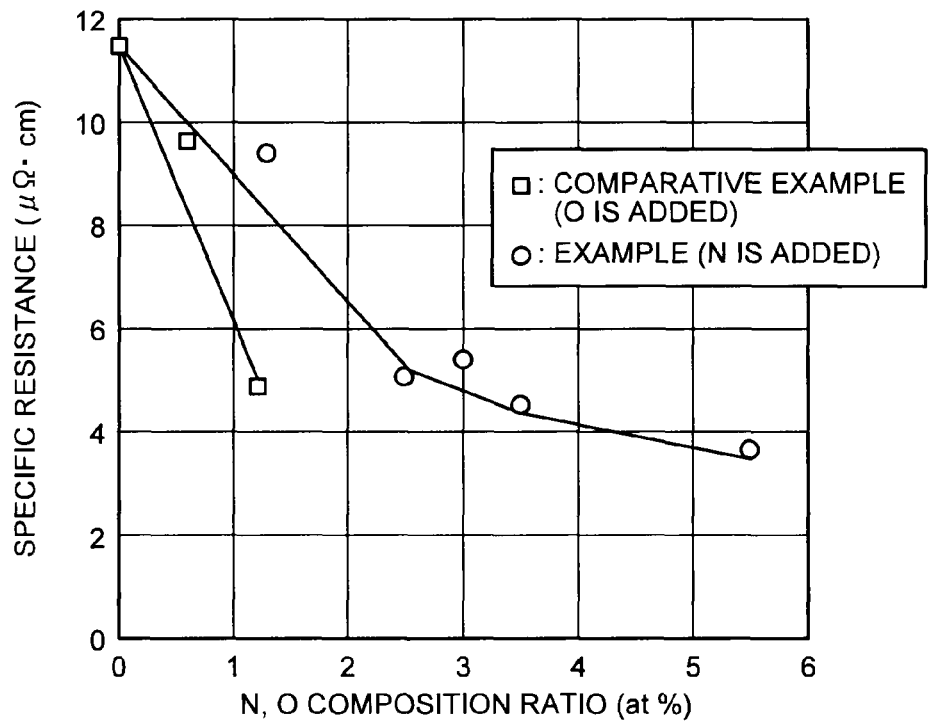
FIG. 6 is a graph of nitrogen composition ratio dependency of the specific resistance of the Ag alloy film in the first embodiment of the present invention.

FIG. 6 is a graph of nitrogen composition ratio dependency of the specific resistance value of the Ag alloy film and is a graph of a relation between nitrogen composition ratios, i.e., nitrogen contents at the time when nitrogen was added at various contents to form Ag alloy films having Mo content of 1.5 at % and the specific resistance values of the Ag alloy films. In FIG. 6, concerning an Ag—Mo—N alloy film, nitrogen composition ratio dependency of an electric specific resistance value immediately after film formation is shown (an example). A result obtained when oxygen was added instead of nitrogen to form an Ag alloy film having Mo content of 1.5 at % is also shown in FIG. 6 (a comparative example). In FIG. 6, the abscissa indicates a composition ratio (at %) of nitrogen atoms or oxygen atoms and the ordinate indicates specific resistance ($\mu\Omega$·cm). In FIG. 6, specific resistance ($\mu\Omega$·cm) of the comparative example in which oxygen was added is indicated by a square sign and specific resistance ($\mu\Omega$·cm) of the example in which nitrogen was added is indicated by a circle sign.

In Table 3, concerning the Ag alloy films of the example and the comparative example, specific resistance ($\mu\Omega$·cm) for each nitrogen composition ratio (nitrogen content) and oxygen composition ratio (oxygen content) is shown.

TABLE 3

| N,O composition ratio (at %) | Specific resistance($\mu\Omega$ · cm) | |
|---|---|---|
| | Comparative example (O was added) | Example (N was added) |
| 0 | 11.44 | 11.44 |
| 0.6 | 9.58 | — |
| 1.2 | 4.88 | — |
| 1.3 | — | 9.36 |
| 2.5 | — | 5.06 |
| 3.0 | — | 5.36 |
| 3.5 | — | 4.54 |
| 5.5 | — | 3.66 |

It is seen from the results shown in FIG. 6 and Table 3, it is possible to reduce the specific resistance value compared with the Ag alloy film not added with nitrogen by adding nitrogen to the Ag alloy film. It was also confirmed that the specific resistance value is reduced when oxygen was added.

Test Example 5

In this test example, concerning an Ag film and an Ag alloy film, annealing for keeping the Ag film and the Ag alloy film at various anneal temperatures for thirty minutes in the atmosphere was carried out after film formation and a relation between specific resistance values and the anneal temperatures was evaluated.

Figures 7, 8:
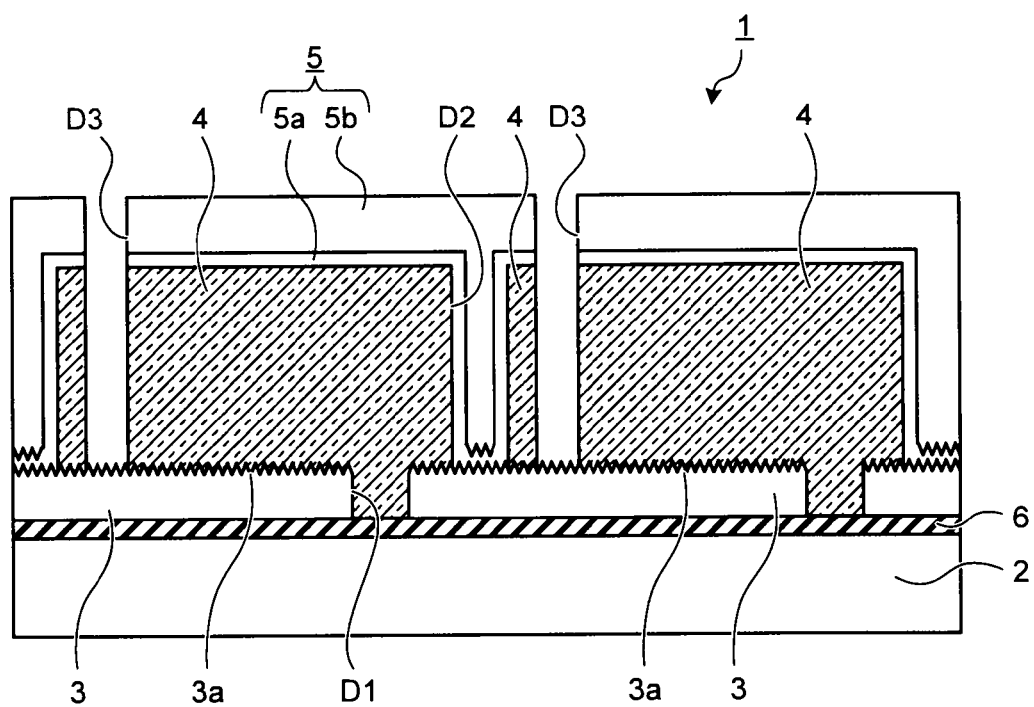

FIG. 7 is a graph of anneal temperature dependency of the specific resistance values of the Ag alloy films in the example and the comparative example. Specific resistance values of the Ag alloy films at respective stages immediately after film formation at the time when nitrogen was added at various contents to form Ag alloy films having Mo content of 1.5 at %, after anneal at 200° C., after anneal at 250° C., and after anneal at 300° C. are plotted. A result obtained when oxygen was added instead of nitrogen to form an Ag alloy film having Mo content of 1.5 at % is also shown in FIG. 7. In FIG. 7, the abscissa indicates anneal temperatures and the ordinate indicates specific resistances ($\mu\Omega$·cm). In FIG. 7, specific resistance values of the examples 1, 2, 4, and 5 are respectively indicated by diamond, triangle, square, and inverted triangle signs. A specific resistance value of the comparative example 5 is indicated by a circle sign.

As shown in FIG. 7, it is seen that, in the examples 1, 2, 4, and 5, the specific resistance values do not increase even after heating and, rather, the specific resistance values can be slightly reduced by the anneal effect. This is considered to be because deterioration in electrical characteristics due to surface oxidation is suppressed by improvement of thermal corrosion resistance.

Test Example 6

In this test example, adhesion to a glass substrate was evaluated concerning the films of the examples and the comparative examples. First, an Ag-1.5Mo—N alloy film was formed at thickness of 200 nanometers on a transparent glass substrate having smooth surface by a sputtering method using a mixed gas of an Ar gas and an $N_2$ gas. A test for sticking a cellophane tape (manufactured by Nichiban Co., Ltd.) having a size of about 18 mm×18 mm to the surface of the obtained film and peeling the cellophane tape (a tape peeling test) was attempted five times. When peeling of the film was not recognized, adhesion was determined as "satisfactory". When peeling of the film was recognized at least once, adhesion was determined as "inferior". An evaluation result is shown in Table 4. In Table 4, adhesion determined as "satisfactory" is indicated by a circle and adhesion determined as "inferior" is indicated by x.

TABLE 4

| | Film composition | Adhesion |
|---|---|---|
| Comparative example 1 | Ag | x |
| Comparative example 5 | Ag-1.5 Mo | x |
| Example 1 | Ag-1.5 Mo-1.3 N | ○ |
| Example 2 | Ag-1.5 Mo-2.5 N | ○ |
| Example 3 | Ag-1.5 Mo-3.0 N | ○ |
| Example 4 | Ag-1.5 Mo-3.5 N | ○ |
| Example 5 | Ag-1.5 Mo-5.5 N | ○ |
| Comparative example 6 | Ag-1.5 Mo-1.2 O | ○ |

As shown in Table 4, adhesion was "inferior" in the Ag film of the comparative example 1 not added with the additional element. The film peeled in all the attempts. Adhesion was "inferior" in the Ag-1.5 at % Mo film of the comparative example 5 added with Mo as the additional element. Compared with the comparative example 1, although improvement tendency was observed, in some case, the film peeled.

On the other hand, in the films of the examples 1 to 5 in which nitrogen is added to Ag-1.5 at % Mo at content equal to or higher than 1.3 at % and equal to or lower than 5.5 at %, peeling of the films was not recognized and improvement of adhesion was recognized. In the case of the comparative example 6 in which oxygen was added at content of 1.2 at %, peeling of the film was not recognized and improvement of adhesion was recognized.

When a film obtained by adding nitrogen to Ag-1.5 at % Mo at content of 0.6 at % was evaluated in the same manner, peeling of the film was not recognized in the tape peeling test. However, slight peeling of the film was recognized on a cut (ruptured) surface in scribe work (glass scribe) in cutting a glass substrate on which this film was formed. In the films of the examples 1 to 5, peeling of the films was not recognized even in the glass scribe.

From the results explained above, it is seen that, by adding nitrogen to the Ag alloy film added with Mo as the additional element, an effect of improving adhesion of the film can be obtained. To obtain an effect of sufficient adhesion improvement, it is desirable to set an added amount of nitrogen to content substantially equal to or higher than at least 0.5 at %, specifically, equal to or higher than 1.3 at %.

As explained above, in the test examples 1 to 3, as shown in FIGS. 2 to 4 and Table 1, by adding nitrogen to the Ag alloy film added with the additional element, it is possible to further suppress a fall in reflectance due to heating compared with the Ag alloy film added with only the additional element and not added with nitrogen. It is possible to improve reflectance with the anneal effect. Compared with addition of an element other than nitrogen, for example, oxygen to the Ag alloy film added with the additional element, it is possible to suppress a fall in reflectance by adding an element other than a metal element.

As shown in FIGS. 2 and 4 and Table 1, when oxygen is added to the Ag alloy film added with the additional element, it is possible to suppress a fall in reflectance due to heating. However, compared with the Ag alloy film not added with oxygen, reflectance immediately after film formation, i.e., reflectance before heating markedly falls. Therefore, this is undesirable as a use for a reflection film.

Therefore, as in the reflecting electrode layer 5*b* of this embodiment, by adding nitrogen to the Ag alloy film added with the additional element, it is possible to remarkably suppress a fall in reflectance compared with the Ag alloy film obtained by adding an element other than nitrogen, for example, oxygen to the Ag alloy film added with the additional element.

In the test examples 4 and 5, as shown in FIGS. 6 and 7 and Table 3, by adding nitrogen to the Ag alloy film added with the additional element, it is possible to prevent an increase in a specific resistance value and deterioration in electrical characteristics of the Ag alloy film unlike the related art. From FIG. 6, it can be said that the effect can also be expected even when the content of nitrogen is equal to or higher than 0.5% at %. The effect of preventing an increase in a specific resistance value and deterioration in electrical characteristics becomes conspicuous as the nitrogen content increases in a range of content equal to or higher than 1.3 at % and equal to or lower than 5.5 at %.

In the test example 6, as shown in Table 4, it is possible to improve adhesion of the Ag alloy film and the glass substrate (a base layer) compared with the related art and improve thermal corrosion resistance. Therefore, the Ag alloy film according to this embodiment is suitable for, in particular, a reflection film, a wiring film, and the like of a device having a heating process. The solar battery could be set outdoor and exposed to a high-temperature environment for a long period. Therefore, by using the Ag alloy film containing nitrogen as the back electrode layer (the reflecting electrode layer), it is possible to prevent reflection characteristics and electrical performance from being deteriorated by a high-temperature environment. After formation of the back electrode layer (the reflecting electrode layer), even when temperature rises in a process of laminate or the like, it is possible to prevent performance from being deteriorated.

As a result of the tests explained above, it was found that, because nitrogen is contained in the metal layer containing Ag as a main component, a metal layer having excellent adhesion and thermal corrosion resistance, and having stable electrical characteristics and satisfactory light reflection characteristics is obtained. In the solar battery according to the first embodiment, because the solar battery includes such a metal layer in the back electrode layer (the reflecting electrode), it is possible to improve performance and reliability of the solar battery.

When a metal layer (an Ag—N alloy film) in which nitrogen is contained in such a metal layer containing Ag as a main component is formed on a light reflection surface side at thickness equal to or larger than 50 nanometers, the effect of reflectance fall prevention is more conspicuous. It can be expected that there is an effect on improvement of reflectance when the content of nitrogen contained in the Ag—N alloy film is substantially equal to or higher than 0.1 at % and equal to or lower than 6 at %. When the content of nitrogen contained in the metal layer is substantially equal to or higher than 0.5 at % and equal to or lower than 5 at %, the effect of improvement of reflectance is more conspicuous and the metal film is excellent in adhesion and thermal corrosion resistance. When the metal film added with nitrogen is an alloy containing one or more kinds of elements selected out of magnesium (Mg), titanium (Ti), chrome (Cr), copper (Cu), molybdenum (Mo), palladium (Pd), platinum (Pt), and gold (Au) as additional components and containing Ag as a main component, the effect of reflectance fall prevention is more conspicuous.

Further, from the viewpoint of reflectance improvement, the content of nitrogen in the Ag alloy film is more desirably equal to or higher than 2.5 at % and equal to or lower than 3.5 at %. By setting the content of nitrogen in the Ag alloy film equal to or higher than 2.5 at % and equal to or lower than 3.5 at %, it is possible to more surely suppress a fall in the reflectance of the Ag alloy film due to heating and further improve the reflectance of the Ag alloy film through the anneal effect. It is possible to more surely prevent an increase in a specific resistance value and deterioration in electrical characteristics.

As explained above, in the module 10 according to this embodiment, because the reflecting electrode layer 5*b* is formed by adding at least nitrogen to the metal layer containing Ag as a main component, unlike the related art, it is possible to improve both adhesion of the reflecting electrode layer 5*b* and the base layer and thermal corrosion resistance. Therefore, in the module 10 according to this embodiment, it is unnecessary to have a structure for reinforcing adhesion for changing composition density only near a junction interface with the base layer. In other words, it is possible to use the module 10 in a single layer film of an Ag—Nx alloy film having a substantially uniform composition in the film. Therefore, the module 10 is excellent in productivity.

Because the module 10 can be used in the single layer film of the Ag—Nx alloy film in this way, for example, it is possible to easily perform an etching process using a chemical obtained by mixing phosphoric acid, nitric acid, and acetic acid publicly known in the past. Therefore, an eaves shape or a necking shape is not caused in a sectional structure of the module 10. Therefore, it is possible to prevent occurrence of failures such as deterioration in pattern accuracy and a pattern failure when a pattern is formed.

The reflecting electrode layer 5b according to this embodiment including such an Ag—Nx alloy film can prevent an increase in a specific resistance value and deterioration in electrical characteristics unlike the related art. Therefore, the reflecting electrode layer 5b of this embodiment is suitable for a reflecting electrode of a solar battery exposed to a heating process and exposed to a high-temperature environment for a long period.

Further, the reflecting electrode layer 5b according to this embodiment can suppress deterioration in light reflection characteristics compared with the related art. Specifically, the reflecting electrode layer 5b according to this embodiment can improve adhesion to the base layer and thermal corrosion resistance without substantially reducing a specific resistance value and a reflectance value. Therefore, the reflecting electrode layer 5b according to this embodiment is suitable as a reflecting electrode of a solar battery.

Because nitrogen is added in the Ag alloy film, it is possible to easily control the content of nitrogen. Consequently, it is possible to realize an Ag alloy film having satisfactory electrical characteristics and optical characteristics with high reproducibility. Because the reflecting electrode layer 5b according to this embodiment includes such an Ag alloy film, it is possible to realize a reflecting electrode having excellent adhesion to the base layer and thermal corrosion resistance, and having stable electrical characteristics and satisfactory light reflection characteristics.

The reflecting electrode layer 5b according to this embodiment is formed by adding nitrogen atoms to the Ag film or the Ag alloy film. Therefore, columnar crystal growth of the Ag film or the Ag alloy film is suppressed and the Ag film or the Ag alloy film is micro-crystallized. Consequently, the reflecting electrode layer 5b having excellent flatness of its surface is formed.

With the module 10 according to this embodiment, the oxidation resistance of the reflecting electrode layer 5b is improved by using the Ag—N alloy film having electrically and optically satisfactory characteristics and containing nitrogen as the reflecting electrode layer 5b. Therefore, a fall in reflectance due to oxidation and clouding is prevented and local oxidation reaction of Ag is prevented. Consequently, a fall in the photoelectric conversion efficiency of the module 10 due to the reflecting electrode layer 5b is prevented. Therefore, with the module 10 according to this embodiment, a solar battery that maintains high photoelectric conversion efficiency is realized.

Therefore, in the module 10 according to this embodiment, the reflecting electrode layer 5b is configured by the Ag—N alloy film having electrically and optically satisfactory characteristics and containing nitrogen. Therefore, a solar battery having high production efficiency, high quality and reliability, and excellent electrical characteristics and optical characteristics is realized.

In the example explained above, nitrogen is added using Ag—Mo alloy added with Mo as an Ag—Nx alloy film. However, the additional element added to Ag is not limited to Mo. Even when nitrogen is added using pure Ag as a base, it is possible to obtain same effects as the effects in this embodiment. Specifically, it is possible to obtain a solar battery including a reflecting electrode having excellent adhesion and thermal corrosion resistance, and having stable electrical characteristics and satisfactory light reflection characteristics.

However, in the case of an Ag alloy added with one or more kinds of elements selected out of the above-mentioned MO, magnesium (Mg), titanium (Ti), chrome (Cr), platinum (Pt), and neodymium (Nd) besides Pd, Au, and Cu shown as the comparative example in Table 1, even only a film of the Ag alloy has a characteristic of improving thermal oxidation resistance. Therefore, the technology of the present invention carried out based on the Ag alloys is desirable because the effects of the present invention can be further displayed compared with the technology based on pure Ag.

A method of manufacturing the module 10 according to the first embodiment configured as explained above is explained below. FIGS. 8-1 to 8-8 are sectional views for explaining an example of a manufacturing process for the module 10 according to the first embodiment and are sectional views corresponding to FIG. 1-2.

First, the translucent insulating substrate 2 is prepared. A flat white plate glass is used as the translucent insulating substrate 2. An $SiO_2$ film is formed as the undercoat layer 6 by the sputtering method on one surface side of the translucent insulating substrate 2. Subsequently, a ZnO film is formed on the undercoat layer 6 by the sputtering method as a transparent conductive film 11 serving as the transparent electrode layer 3 (FIG. 8-1). As materials forming the transparent conductive film 11, besides the ZnO film, transparent conductive oxide films of ITO, $SnO_2$, and the like and films obtained by adding a metal such as Al to the transparent conductive oxide films to improve their electric conductivities can be used. As a film forming method, other film forming methods such as a CVD method can be used.

Thereafter, the surface of the transparent conductive film 11 is etched and roughened by dilute hydrochloric acid to form the small unevenness 3a on the surface of the transparent conductive film 11 (FIG. 8-2). However, when the transparent conductive film 11 of $SnO_2$, ZnO, or the like is formed by the CVD method, unevenness is formed on the surface of the transparent conductive film 11 in a self-organized manner. Therefore, it is unnecessary to form unevenness by etching using dilute hydrochloric acid.

A part of the transparent electrode layer 3 is cut and removed in a stripe shape in a direction substantially parallel to the lateral direction of the translucent insulating substrate 2 to pattern the transparent electrode layer 3 in a strip shape and separate the transparent electrode layer 3 into a plurality of transparent electrode layers 3 (FIG. 8-3). The patterning of the transparent electrode layer 3 is performed by forming, with a laser scribe method, the stripe-like first grooves D1 extending in the direction substantially parallel to the lateral direction of the translucent insulating substrate 2 and reaching the translucent insulating substrate 2. To obtain the transparent electrode layers 3 separated from one another in a substrate surface on the glass substrate 2 in this way, a method of etching the transparent electrode layer 3 using a resist mask formed by photoengraving or the like or a method such as an evaporation method using a metal mask can also be adopted.

The photoelectric conversion layer 4 is formed on the transparent electrode layer 3 including the first grooves D1 by a plasma CVD method. In this embodiment, as the photoelectric conversion layer 4, a p-type hydrogenated crystallite silicon (μc-Si:H) layer, an i-type hydrogenated crystallite silicon (μc-Si:H) layer, and an n-type hydrogenated crystallite silicon (μc-Si:H) layer are sequentially laminated and formed from the transparent electrode layer 3 side (FIG. 8-4).

Patterning is applied to the photoelectric conversion layer 4, which is laminated and formed as explained above, by laser scribe as in the transparent electrode layer 3 (FIG. 8-5). Specifically, a part of the photoelectric conversion layer 4 is cut and removed in a stripe shape in the direction substantially parallel to the lateral direction of the translucent insulating substrate 2 to pattern the photoelectric conversion layer 4 into a strip shape and separate the photoelectric conversion layer 4. The patterning of the photoelectric conversion layer 4 is performed by forming, with the laser scribe method, the stripe-like second grooves (the connection grooves) D2 extending in the direction substantially parallel to the lateral direction of the translucent insulating substrate 2 and reaching the transparent electrode layer 3 in places different from the first grooves D1. After the formation of the second grooves (the connection grooves) D2, scatters adhering in the second grooves (the connection grooves) D2 are removed by high-pressure water cleaning, megasonic cleaning, or brush cleaning.

The transparent conductive metal compound layer 5a formed of tin oxide ($SnO_2$) is formed by vacuum evaporation on the photoelectric conversion layer 4 and in the second grooves (the connection grooves) D2 as the back electrode layer 5 (FIG. 8-6). Other film forming method such as the CVD method can be used as the film forming method for the transparent conductive metal compound layer 5a.

An Ag—N alloy film containing nitrogen in Ag is formed as the reflecting electrode layer 5b on the transparent conductive metal compound layer 5a (FIG. 8-6). At this point, the reflecting electrode layer 5b is formed under a condition that the reflecting electrode layer 5b fills the inside of the second grooves D2. In this embodiment, a manufacturing method for the reflecting electrode layer 5b includes, after an Ag—N alloy film forming step for forming an Ag—N alloy film containing nitrogen, an anneal step for annealing, at temperature set in advance, the Ag—N alloy film formed at the Ag—N alloy film forming step.

At the Ag—N alloy film forming step, the Ag—N alloy film is formed by sputtering under a gas atmosphere containing a nitrogen gas such that nitrogen is contained in the Ag—N alloy film at content equal to or higher than 0.1 at % and equal to or lower than 6 at %. It is more desirable if nitrogen is contained in the Ag—N alloy film at content equal to or higher than 0.5 at % and equal to or lower than 5 at %.

Specifically, sputtering under a plasma atmosphere of a mixed gas, which is obtained by adding a nitrogen ($N_2$) gas to an inert gas, is performed using, as a target, an alloy target in which the additional element is added to Ag, in this embodiment, an Ag—Mo alloy target to form an Ag alloy film. As the inert gas, a rare gas such as argon (Ar) gas is used. It is possible adjust the content of nitrogen in the Ag alloy film by controlling a partial pressure of the nitrogen gas in the mixed gas. Specifically, for example, it is possible to form an Ag alloy film containing nitrogen at content equal to or higher than 1.3 at % and equal to or lower than 5.5 at % by appropriately selecting, for example, the partial pressure of the nitrogen gas in the mixed gas in a range of pressure equal to or higher than 1.5% and equal to or lower than 12% of the total pressure of the mixed gas. Further, it is possible to adjust the content of nitrogen in a range of content equal to or higher than 0.1 at % and equal to or lower than 6 at % or a range of content equal to or higher than 0.5 at % and equal to or lower than 5 at %.

By performing the sputtering explained above, a metal layer containing Ag as a main component is deposited in plasma of gas containing the nitrogen gas. Therefore, it is possible to uniformly contain nitrogen in the film and easily form an Ag alloy film with high reproducibility. As a film forming method using plasma, a plasma deposition method or the like can be used besides the sputtering method.

The thickness of the Ag—N alloy film containing nitrogen formed in this way is set to at least 50 nanometer or more. When the thickness of the Ag—N alloy film containing nitrogen is smaller than 50 nanometers, the reflectance and the electric resistance of the Ag—N alloy film are high. Representative thickness of the Ag—N alloy film is, for example, 150 to 500 nanometers.

After the Ag—N alloy film is formed at the Ag—N alloy film forming step, the formed Ag—N alloy film is annealed at temperature set in advance (hereinafter referred to as "anneal temperature" in some case) at the anneal step, whereby an Ag—N alloy film containing nitrogen serving as the reflecting electrode layer 5b is manufactured. The anneal temperature is selected from, for example, temperature equal to or higher than 200° C. and equal to or lower than 300° C.

After the formation of the reflecting electrode layer 5b, a part of the back electrode layer 5 and the photoelectric conversion layers 4 is cut and removed in a stripe shape in the direction substantially parallel to the lateral direction of the translucent insulating substrate 2 to pattern the back electrode layer 5 and the photoelectric conversion layer 4 into a strip shape and to separate the back electrode layer 5 and the photoelectric conversion layer 4 into a plurality of cells 1 (FIG. 8-7). The patterning is performed by forming, with the laser scribe method, the stripe-like third grooves (the separation grooves) D3 extending in the direction substantially parallel to the lateral direction of the translucent insulating substrate 2 and reaching the transparent electrode layer 3 in places different from the first grooves D1 and the second grooves (the connection grooves) D2. Because it is difficult to cause the back electrode layer 5 having high reflectance to directly absorb laser, the photoelectric conversion layer 4 is caused to absorb laser beam energy and the back electrode layer 5 is locally blown off together with the photoelectric conversion layer 4, whereby the back electrode layer 5 and the photoelectric conversion layer 4 are separated to correspond to the cells 1.

Consequently, the module 10 according to the first embodiment including the cells 1 shown in FIGS. 1-1 and 1-2 is completed.

As explained above, in the method of manufacturing a thin-film solar battery according to the first embodiment, at the forming step for the reflecting electrode layer 5b, an Ag—N alloy film is formed by sputtering under a gas atmosphere containing a nitrogen gas. Therefore, it is possible to form an Ag—N alloy film containing nitrogen without increasing manufacturing steps. Consequently, compared with the related art, manufacturing cost can be reduced. Nitrogen is added in the Ag—N alloy film by the sputtering under the gas atmosphere containing the nitrogen gas. Therefore, it is possible to easily control the content of nitrogen in the Ag—N alloy film by adjusting an amount of the nitrogen gas. Consequently, it is possible to form an Ag—N alloy film having satisfactory electrical characteristics and optical characteristics and containing nitrogen with high reproducibility. Therefore, with the method of manufacturing a thin-film solar battery according to the first embodiment, it is possible to inexpensively manufacture a solar battery including a reflecting electrode having excellent adhesion and thermal corrosion resistance, and having stable electrical characteristics and satisfactory light reflection characteristics.

In this embodiment, after the Ag—N alloy film forming step, at the anneal step, the Ag—N alloy film containing nitrogen formed at the Ag—N alloy film forming step is annealed at the temperature set in advance. Therefore, it is possible to improve the electrical characteristics of the Ag—N alloy film and reduce resistance. Consequently, it is possible to more surely manufacture a reflecting electrode having excellent adhesion and thermal corrosion resistance and having stable electrical characteristics and satisfactory light reflection characteristics.

In this embodiment, the Ag—N alloy film containing nitrogen is excellent in adhesion to the base as explained above. Therefore, the film does not peel and can be formed as a single layer film. The Ag—N alloy film is formed as a single layer film containing nitrogen from a reflection surface side to a rear surface side in the same manner. Therefore, the configuration and manufacturing of the Ag—N alloy film are simplified and the entire Ag—N alloy film contains nitrogen. Therefore, the effect of preventing deterioration is improved.

Therefore, in the method of manufacturing a thin-film solar battery according to the first embodiment, it is possible to improve production efficiency and efficiently manufacture a solar battery having high quality and reliability. Other conductive layers can be further laminated on the rear surface side of the metal layer added with nitrogen in this way to form a reflecting electrode.

In this embodiment, the example in which the silicon material is used for the photoelectric conversion layer 4 is explained. However, the material of the photoelectric conversion layer 4 is not limited to this. The same effects can be obtained in a solar battery including any one or a plurality of materials of silicon germanium, copper, indium, gallium, and selenium.

Second Embodiment

In this embodiment, the application of the present invention to a solar battery obtained by processing the surface of a monocrystal silicon substrate or a polycrystal silicon substrate (hereinafter referred to as silicon substrate type solar battery) is explained. Specifically, an example in which the technology of the present invention is applied to a reflecting layer section that includes a photoelectric conversion layer made of a silicon substrate and is used to reflect light passed through the photoelectric conversion layer to the photoelectric conversion layer again is explained.

Figure 9:
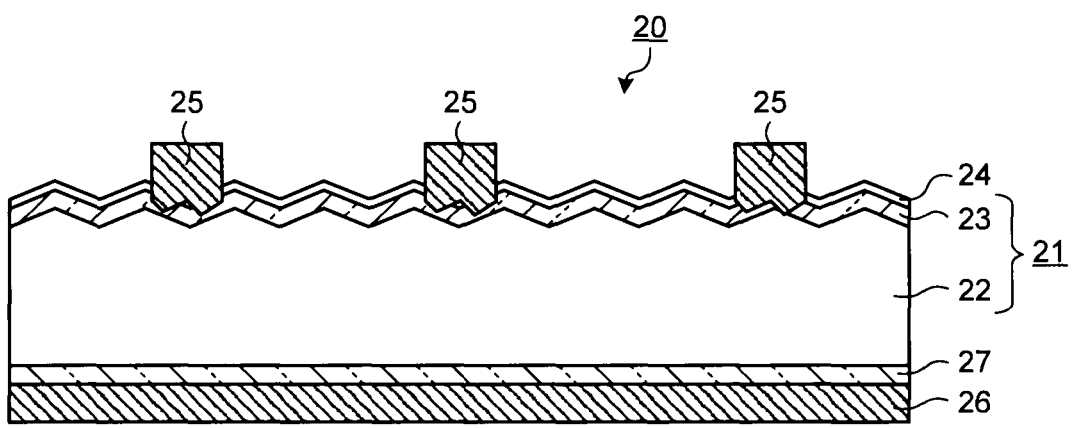
FIG. 9 is a sectional view for explaining the configuration of a silicon substrate type solar battery according to a second embodiment of the present invention.

FIG. 9 is a sectional view for explaining the configuration of a silicon substrate type solar battery 20 according to the second embodiment. The silicon substrate type solar battery 20 according to this embodiment includes a semiconductor substrate 21 that is a solar battery substrate having a photoelectric conversion function and has a pn junction, a reflection preventing film 24 that is formed on a surface on a light receiving side (a front surface) of the semiconductor substrate 21 and prevents reflection of incident light on the light receiving surface, light receiving surface side electrodes 25 that are first electrodes formed to be surrounded by the reflection preventing film 24 on the surface on the light receiving surface side (the front surface) of the semiconductor substrate 21, and a reflecting electrode layer 26 that is a second electrode formed on a surface on the opposite side of the light receiving surface (a rear surface) of the semiconductor substrate 21.

The semiconductor substrate 21 includes a p-type (first conductivity type) silicon layer 22 and an n-type (second conductivity type) impurity diffusion layer 23 having a conductivity type reversed from the conductivity type of the surface of the p-type silicon layer 22. The pn junction is formed by the p-type silicon layer 22 and the n-type impurity diffusion layer 23. As the light receiving surface side electrodes 25, a surface silver grid electrode and a surface silver bus electrode of a solar battery are included (not shown). The surface silver grid electrode is locally provided on the light receiving surface to collect electricity generated by the semiconductor substrate 21. The surface silver bus electrode is provided substantially orthogonal to the surface silver grid electrode to extract the electricity collected by the surface silver grid electrode. The reflecting electrode layer 26 is formed over the entire surface of the rear surface of the semiconductor substrate 21.

A p+ layer (BSF (Back Surface Field)) 27, which is a p-type high-density layer containing high-density impurities, is formed on a surface layer section on the rear surface (the surface on the opposite side of the light receiving surface) side of the semiconductor substrate 21. The p+ layer (BSF) 27 is provided to obtain a BSF effect and increases an electron density of a p-type layer (the semiconductor substrate 21) in an electric field of a band structure to prevent electrons in the p-type layer (the semiconductor substrate 21) from disappearing.

As the reflecting electrode layer 26 according to this embodiment, an Ag—N alloy film containing nitrogen in Ag at content equal to or higher than 0.5 at % and equal to or lower than 5 at % is used. Specifically, like the reflecting electrode layer 5b according to the first embodiment, the reflecting electrode layer 26 according to this embodiment includes an Ag film or an Ag alloy film. The Ag alloy film contains nitrogen at content equal to or higher than 0.5 at % and equal to or lower than 5 at %. The Ag—N alloy film has a low specific resistance value like the reflecting electrode layer 5b and has high reflectance. As in the case of the first embodiment, the Ag alloy film is an alloy film containing silver (Ag) as a main component and containing one or more kinds of elements selected out of magnesium (Mg), titanium (Ti), chrome (Cr), copper (Cu), molybdenum (Mo), palladium (Pd), platinum (Pt), and gold (Au) as additional components. "Main component" means a component having the highest atom content. Pure Ag is also contained in the Ag—N alloy film.

The Ag—N alloy film having electrically and optically satisfactory characteristics and containing nitrogen is used as the reflecting electrode layer 26 in this way, whereby the silicon substrate type solar battery 20 having electrically and optically satisfactory characteristics is realized. Because the Ag—N alloy film is excellent in adhesion to the base layer as explained above, peeling of the film from the p-type silicon layer 22 (the p+ layer 27) does not occur and the Ag—N alloy film can be formed as a single layer film.

Therefore, with the silicon substrate type solar battery 20 according to the second embodiment, as in the case of the thin-film solar battery according to the first embodiment, a silicon substrate type solar battery having high production efficiency and high quality and reliability is realized.

The reflecting electrode layer 26 according to this embodiment is formed by adding nitrogen atoms in the Ag film or the Ag alloy film. Therefore, columnar crystal growth of the Ag film or the Ag alloy film is suppressed and the Ag film or the Ag alloy film is micro-crystallized. Consequently, the reflecting electrode layer 26 having excellent flatness of its surface is formed.

With the silicon substrate type solar battery 20 according to the second embodiment, the oxidation resistance of the reflecting electrode layer 26 is improved by using the Ag—N alloy film having electrically and optically satisfactory characteristics and containing nitrogen as the reflecting electrode layer 26. Therefore, a fall in reflectance due to oxidation and clouding is prevented and local oxidation reaction of Ag is prevented. Consequently, a fall in the photoelectric conversion efficiency of the silicon substrate type solar battery 20 due to the reflecting electrode layer 26 is prevented. Therefore, with the silicon substrate type solar battery 20 according to the second embodiment, the silicon substrate type solar battery 20 that maintains high photoelectric conversion efficiency is realized.

Figures 1, 10:
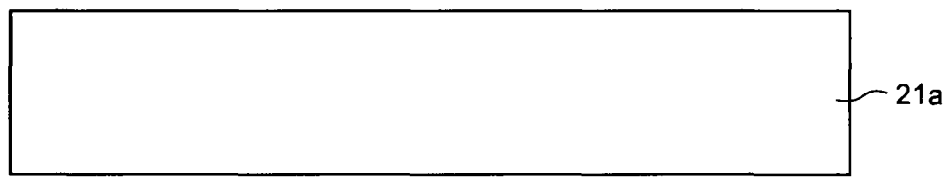
Figures 2, 10:
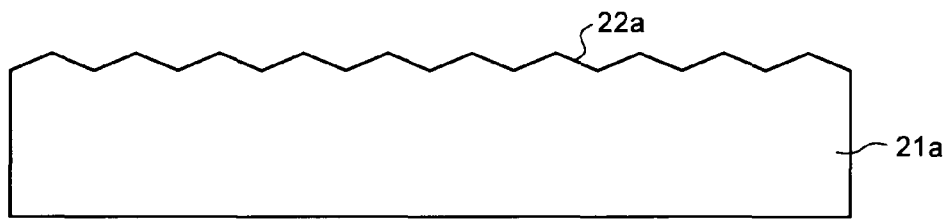
Figures 3, 10:
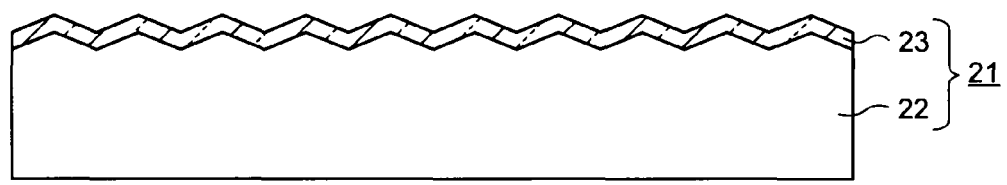
Figures 4, 10:
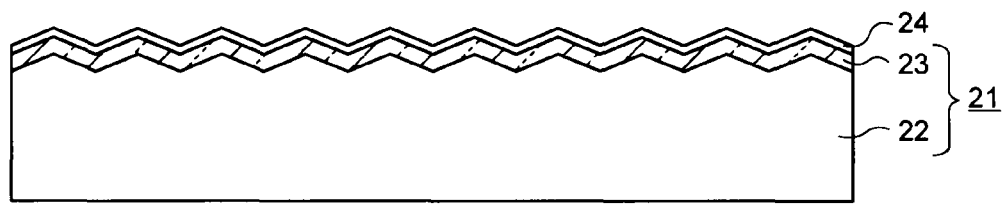
Figures 5, 10:
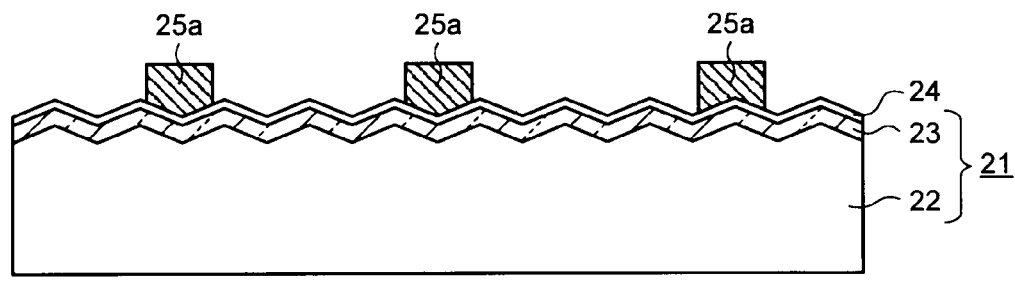
Figures 6, 10:
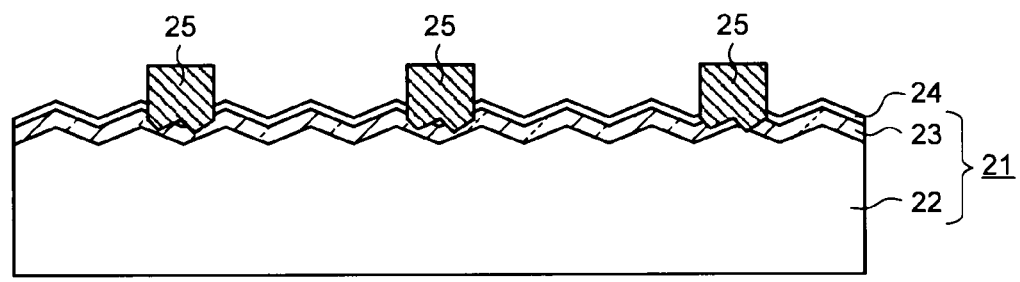
Figures 7, 10:
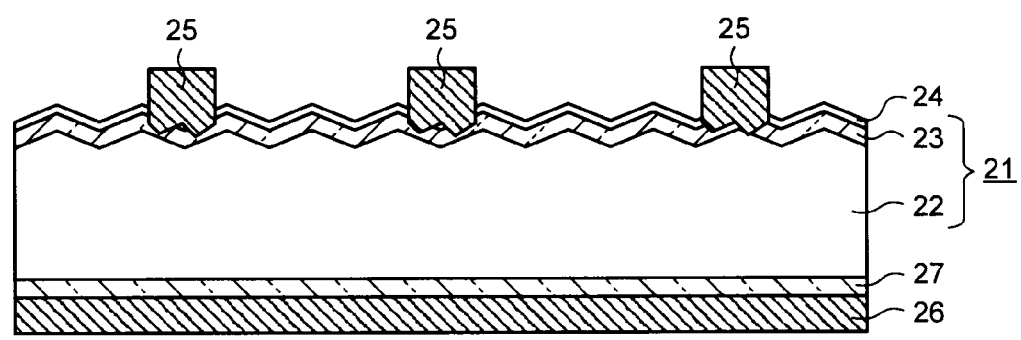

A method of manufacturing the silicon substrate type solar battery 20 according to this embodiment is explained below with reference to the drawings. FIGS. 10-1 to 10-8 are sectional views for explaining an example of a manufacturing process for the silicon substrate type solar battery 20 according to the second embodiment.

First, a p-type monocrystal silicon substrate having thickness of, for example, several hundred micrometers is prepared as a semiconductor substrate 21a, which is the p-type silicon layer (FIG. 10-1). Because the p-type monocrystal silicon substrate is manufactured by slicing, with a wire saw, an ingot formed by cooling and solidifying melted silicon, damage during the slicing remains on the surface. Therefore, the p-type monocrystal silicon substrate is immersed in acid or a heated alkali solution, for example, a sodium hydroxide aqueous solution to etch the surface to thereby remove a damaged area that occurs during slicing of a silicon substrate and is present near the surface of the p-type monocrystal silicon substrate. The p-type silicon substrate used for the semiconductor substrate can be either monocrystal or polycrystal.

Following the damage removal, an anisotropic etching is applied to one surface side of the p-type monocrystal silicon substrate with a solution obtained by adding IPA (isopropyl alcohol) to the same alkali solution and very small unevenness is formed on the surface on the light receiving surface side of the p-type single crystal silicon substrate to form a texture structure 22a (FIG. 10-2). Such a texture structure is provided on the light receiving surface side of the p-type monocrystal silicon substrate. Consequently, it is possible to cause multiple reflection of light on the surface side of the silicon substrate type solar battery 20 and efficiently absorb light incident on the solar battery cell 1 into the inside of the semiconductor substrate 21. It is possible to effectively reduce its reflectance and improve its conversion efficiency.

Subsequently, a pn junction is formed on the semiconductor substrate 21a (FIG. 10-3). Specifically, a V group element such as phosphorus (P) is, for example, diffused over the semiconductor substrate 21a to form the n-type impurity diffusion layer 23 having a thickness of several hundred nanometers. Specifically, phosphorus oxychloride ($POCl_3$) is diffused over the p-type monocrystal silicon substrate, on the surface of which the texture structure is formed, by thermal diffusion to form a pn junction. Consequently, the semiconductor substrate 21 on which the pn junction is formed is obtained by the p-type silicon layer 22 formed of p-type monocrystal silicon, which is the first conductive layer, and the n-type impurity diffusion layer 23, which is the second conductive layer, formed on the light receiving surface side of the p-type silicon layer 22.

At this diffusing step, the p-type monocrystal silicon substrate is thermally diffused, for example, at high temperature of 800° C. to 900° C. for several tens minutes in a mixed gas atmosphere of, for example, a phosphorus oxychloride ($POCl_3$) gas, a nitrogen gas, and an oxygen gas by a vapor phase diffusion method to uniformly form the n-type impurity diffusion layer 23 in which phosphorus (P) is diffused over the surface layer of the p-type monocrystal silicon substrate.

A vitreous (PSG: Phospho-Silicate Glass) layer deposited on the surface during the diffusion processing is formed on the surface immediately after the formation of the n-type impurity diffusion layer 23. Therefore, the phospho-silicate glass layer is removed using a fluorinated acid solution or the like.

Although not shown in the figure, the n-type impurity diffusion layer 23 is formed over the entire surface of the semiconductor substrate 21. Therefore, to remove the influence of the n-type impurity diffusion layer 23 formed on the rear surface or the like of the semiconductor substrate 21, the n-type impurity diffusion layer 23 is left only on the light receiving surface side of the semiconductor substrate 21 and the n-type impurity diffusion layer 23 in the other areas is removed. The n-type impurity diffusion layer 23 can be formed only on the light receiving surface side of the semiconductor substrate 21.

To improve photoelectric conversion efficiency, the reflection preventing film 24 is formed at a uniform thickness on one surface on the light receiving surface side of the p-type monocrystal silicon substrate (FIG. 10-4). The thickness and the refractive index of the reflection preventing film 24 are set to values for suppressing light reflection most. As the formation of the reflection preventing film 24, a silicon nitride film is formed as the reflection preventing film 24 under conditions of temperature equal to or higher than 300° C. and decompression using a mixed gas of a silane ($SiH_4$) gas and an ammonium ($NH_3$) gas as a raw material using, for example, the plasma CVD method. The refractive index is, for example, about 2.0 to 2.2. An optimum thickness of the reflection preventing film is, for example, 70 nanometers to 90 nanometers. As the reflection preventing film 24, films of two or more layers having different refractive indexes can be laminated. As a method of forming the reflection preventing film 24, besides the plasma CVD method, the evaporation method, the thermal CVD method, and the like can be used.

Subsequently, electrodes are formed by screen printing. First, the light receiving surface side electrodes 25 are manufactured (before baking). Specifically, after silver paste 25a, which is electrode material paste containing glass frit, is applied by the screen printing in the shapes of the surface silver grid electrode and the surface silver bus electrode on the reflection preventing film 24, which is the light receiving surface of the p-type monocrystal silicon substrate, the silver paste is dried (FIG. 10-5).

Thereafter, the electrode paste on the surface of the semiconductor substrate 21 is baked at, for example, 600° C. to 900° C., whereby, on the front side of the semiconductor substrate 21, a silver material comes into contact with silicon and solidifies again while the reflection preventing film 24 is melted by the glass material contained in the silver paste 25a. Consequently, the light receiving surface side electrodes 25 are obtained and conduction between the light receiving surface side electrodes 25 and the semiconductor substrate 21 is secured (FIG. 10-6).

An Ag film or an Ag alloy film containing nitrogen at content equal to or higher than 0.5 at % and equal to or lower than 5 at %, for example, an Ag—Mo—N alloy film is formed as the reflecting electrode layer 26 by the sputtering method on the rear surface side of the p-type monocrystal silicon substrate. For example, using an alloy target having Ag-1.5 at % Mo composition, sputtering is applied to the rear surface side of the p-type monocrystal silicon substrate under a plasma atmosphere of a mixed gas obtained by adding a nitrogen (N₂) gas to an argon (Ar) gas, which is an inert gas, to form an Ag—Mo—N alloy film containing nitrogen at content equal to or higher than 0.5 at % and equal to or lower than 5 at %.

Thereafter, the Ag—Mo—N alloy film is annealed at a temperature of, for example, 200° C. to 300° C. Consequently, the Ag—Mo—N alloy film reacts with silicon of the semiconductor substrate 21 and the p+ layer 27 is formed immediately under the reflecting electrode layer 26 (FIG. 10-7).

By carrying out the steps explained above, it is possible to manufacture the silicon substrate type solar battery 20 according to this embodiment shown in FIG. 9.

As explained above, in the method of manufacturing the silicon substrate type solar battery 20 according to the second embodiment, the Ag—N alloy film containing nitrogen at content equal to or higher than 0.5 at % and equal to or lower than 5 at % is formed as the reflecting electrode layer 26. Consequently, it is possible to manufacture the silicon substrate type solar battery 20 having electrically and optically satisfactory characteristics.

Because the Ag—N alloy film is excellent in adhesion to the base layer as explained above, peeling of the film from the p-type silicon layer 22 (the p+ layer 27) does not occur and the Ag—N alloy film can be formed as a single layer film. Therefore, with the method of manufacturing the silicon substrate type solar battery 20 according to the second embodiment, it is possible to increase production efficiency and efficiently manufacture the silicon substrate type solar battery 20 having high quality and reliability.

Because the reflecting electrode layer 26 is formed by adding nitrogen atoms to the Ag film or the Ag alloy film, it is possible to suppress columnar crystal growth of the Ag film or the Ag alloy film and micro-crystallize the Ag film or the Ag alloy film. Consequently, it is possible to form the reflecting electrode layer 26 having excellent flatness of its surface.

With the silicon substrate type solar battery 20 according to the second embodiment, the oxidation resistance of the reflecting electrode layer 26 is improved because the Ag film or the Ag alloy film having electrically and optically satisfactory characteristics is formed as the reflecting electrode layer 26. Therefore, a fall in reflectance due to oxidation and clouding is prevented and local oxidation reaction of Ag is prevented. Consequently, it is possible to prevent a fall in photoelectric conversion efficiency of the silicon substrate type solar battery 20 due to the reflecting electrode layer 26. Therefore, with the silicon substrate type solar battery 20 according to the second embodiment, it is possible to manufacture the silicon substrate type solar battery 20 that maintains a high photoelectric conversion efficiency.

The embodiments explained above are merely examples of the present invention and the configuration can be changed within the scope of the present invention.

INDUSTRIAL APPLICABILITY

As explained above, the solar battery according to the present invention is useful for realizing a solar battery having high reliability, excellent electrical characteristics and optical characteristics.

REFERENCE SIGNS LIST

1 THIN-FILM SOLAR BATTERY CELL (CELL)
2 TRANSLUCENT INSULATING SUBSTRATE (GLASS SUBSTRATE)
3 TRANSPARENT ELECTRODE LAYER
3a UNEVENNESS
4 PHOTOELECTRIC CONVERSION LAYER
5 BACK ELECTRODE LAYER
5a TRANSPARENT CONDUCTIVE METAL COMPOUND LAYER
5b REFLECTING ELECTRODE LAYER
6 UNDERCOAT LAYER
10 MODULE
D1 FIRST GROOVES
D2 SECOND GROOVES (CONNECTION GROOVES)
D3 THIRD GROOVES (SEPARATION GROOVES)
20 SILICON SUBSTRATE TYPE SOLAR BATTERY
21 SEMICONDUCTOR SUBSTRATE
22 p-TYPE (FIRST CONDUCTIVITY TYPE) SILICON LAYER
22a TEXTURE STRUCTURE
23 n-TYPE (SECOND CONDUCTIVITY TYPE) IMPURITY DIFFUSION LAYER
24 REFLECTION PREVENTING LAYER
25 LIGHT RECEIVING SURFACE SIDE ELECTRODE
25a SILVER PASTE
27 p+ Layer

The invention claimed is:

1. A solar battery, comprising:
a photoelectric conversion layer comprising a light incident side and a side opposite the light incident side, the photoelectric conversion layer configured to convert light into electricity; and
a reflecting electrode on the side opposite the light incident side of the photoelectric conversion layer,
wherein the reflecting electrode is configured to reflect light passed through the photoelectric conversion layer to the photoelectric conversion layer,
the reflecting electrode comprises a metal layer on a side of the reflecting electrode that faces the photoelectric conversion layer,
the metal layer comprises silver as a main component,
the metal layer further comprises nitrogen, and
a content of nitrogen in the metal layer is equal to or higher than 2.5 at % and equal to or lower than 5 at %.

2. The solar battery of claim 1, wherein a thickness of the metal layer is equal to or larger than 50 nanometers.

3. The solar battery of claim 1, wherein a content of nitrogen in the metal layer is equal to or higher than 2.5 at % and equal to or lower than 3.5 at %.

4. The solar battery of claim 1, wherein the metal layer further comprises at least one element selected from the group consisting of magnesium, titanium, chromium, copper, molybdenum, palladium, platinum, and gold.

5. The solar battery of claim 1, further comprising a transparent conductive metal compound layer.

6. The solar battery of claim 5, wherein the transparent conductive metal compound layer comprises tin oxide, zinc oxide, or indium tin oxide.

7. The solar battery of claim 5, wherein the thickness of the metal layer is equal to or larger than 150 nanometers.

8. The solar battery of claim 2, wherein the thickness of the metal layer is 500 nanometers or less.

9. The solar battery of claim 4, wherein the metal layer comprises molybdenum.

10. A method of manufacturing the solar battery of claim 1, the method comprising:
forming the photoelectric conversion layer; and
forming the reflecting electrode on the side opposite the light incident side of the photoelectric conversion layer; whereby the solar battery of claim 1 is formed.

11. The method of claim 10,
wherein a thickness of the metal layer is equal to or larger than 50 nanometers.

12. The method of claim 10, wherein forming the reflecting electrode comprises forming the metal layer by depositing silver (Ag) on the photoelectric conversion layer under a plasma atmosphere of a nitrogen gas.

13. The method of claim 12,
wherein forming the metal layer comprises sputtering with a target while supplying gas,
the target comprises silver (Ag) as a main component, and the gas comprises the nitrogen gas.

14. The method of claim 10, further comprising annealing the metal layer.

15. The method of claim 14, wherein annealing the metal layer is at a temperature of from 200° C. to 300° C.

* * * * *